United States Patent
Ohtani et al.

[11] Patent Number: 5,994,172
[45] Date of Patent: Nov. 30, 1999

[54] METHOD FOR PRODUCING SEMICONDUCTOR DEVICE

[75] Inventors: Hisashi Ohtani; Takeshi Fukunaga; Akiharu Miyanaga, all of Kanagawa, Japan

[73] Assignee: Semiconductor Energy Laboratory., Ltd., Kanagawa, Japan

[21] Appl. No.: 09/055,982

[22] Filed: Apr. 7, 1998

Related U.S. Application Data

[62] Division of application No. 08/496,529, Jun. 29, 1995.

[30] Foreign Application Priority Data

Jul. 1, 1994 [JP] Japan ................................ 6-173571
Apr. 10, 1995 [JP] Japan ................................ 7-109985

[51] Int. Cl.$^6$ ............................ H01L 21/00; H01L 21/20
[52] U.S. Cl. ........................ 438/151; 438/166; 438/487
[58] Field of Search ............................ 438/151, 166, 438/487

[56] References Cited

U.S. PATENT DOCUMENTS

| | | | |
|---|---|---|---|
| 5,147,826 | 9/1992 | Liu et al. | 437/233 |
| 5,219,786 | 6/1993 | Noguchi | 437/174 |
| 5,275,851 | 1/1994 | Fonash et al. | 427/578 |
| 5,366,926 | 11/1994 | Mei | 437/173 |
| 5,403,772 | 4/1995 | Zhang et al. . | |
| 5,426,064 | 6/1995 | Zhang et al. | 437/40 |
| 5,481,121 | 1/1996 | Zhang et al. . | |
| 5,488,000 | 1/1996 | Zhang et al. | 437/21 |
| 5,492,843 | 2/1996 | Adachi et al. . | |
| 5,501,989 | 3/1996 | Takayama et al. . | |
| 5,508,533 | 4/1996 | Takemura . | |
| 5,529,937 | 6/1996 | Zhang et al. . | |
| 5,534,716 | 7/1996 | Takemura . | |
| 5,543,352 | 8/1996 | Ohtani et al. . | |
| 5,550,070 | 8/1996 | Funai | 437/41 |
| 5,563,426 | 10/1996 | Zhang et al. . | |
| 5,569,610 | 10/1996 | Zhang et al. | 437/21 |
| 5,569,936 | 10/1996 | Zhang et al. . | |

(List continued on next page.)

OTHER PUBLICATIONS

R. Kakkad et al., "Crystallized Si films by low–temperature rapis thermal annealing of amorphous silicon," J. Appl. Phys., vol. 65, No. 5, Mar. 1, 1989, pp. 2069–2072.

G. Liu et al., "Polycrystalline silicon thin film transistors on Corning 7059 glass substrates using short time, Low–temperature processing," Appl. Phys. Lett., vol. 62, No. 20, May 17, 1993, pp. 2554–2556.

(List continued on next page.)

*Primary Examiner*—John F. Niebling
*Assistant Examiner*—Michael S. Lebentritt
*Attorney, Agent, or Firm*—Sixbey, Friedman, Leedom & Ferguson, P.C.; Gerald J. Ferguson, Jr.; Jeffrey L. Costellia

[57] ABSTRACT

A metal element density is lowered in a crystalline silicon film obtained by four hour treatment at about 550° C. by using a catalyst metal which accelerates crystallization. At the same time, a crystalline silicon film can be obtained which has a high crystallinity. For this purpose, extremely oxide film 13 is formed on an amorphous silicon film formed on this glass substrate in the beginning. An aqueous solution of acetate added with 10 to 200 ppm (need adjustment) of catalyst element like nickel or the like is dripped. This state is held for a predetermined time. Then the spin drying is performed by using a spinner. The film is crystallized by four hour treatment at 550° C. Then a localized nickel component is removed by the fluoric acid treatment. Further, the crystalline silicon film is obtained by laser light irradiation. Then a crystalline silicon film is obtained having a low density of metal element and a small defect density by four hour heat treatment at 550° C.

28 Claims, 16 Drawing Sheets

U.S. PATENT DOCUMENTS

| | | |
|---|---|---|
| 5,580,792 | 12/1996 | Zhang et al. . |
| 5,585,291 | 12/1996 | Ohtani et al. . |
| 5,589,694 | 12/1996 | Takayama et al. . |
| 5,595,923 | 1/1997 | Zhang et al. . |
| 5,595,944 | 1/1997 | Zhang et al. . |
| 5,604,360 | 2/1997 | Zhang et al. . |
| 5,605,846 | 2/1997 | Ohtani et al. . |
| 5,606,179 | 2/1997 | Yamazaki et al. . |
| 5,608,232 | 3/1997 | Yamazaki et al. . |
| 5,612,250 | 3/1997 | Ohtani et al. . |
| 5,614,426 | 3/1997 | Funada et al. . |
| 5,614,733 | 3/1997 | Zhang et al. . |
| 5,616,506 | 4/1997 | Takemura . |
| 5,620,910 | 4/1997 | Teramoto . |
| 5,621,224 | 4/1997 | Yamazaki et al. . |
| 5,624,851 | 4/1997 | Takayama et al. . |
| 5,637,515 | 6/1997 | Takemura . |
| 5,639,698 | 6/1997 | Yamazaki et al. . |
| 5,643,826 | 7/1997 | Ohtani et al. . |
| 5,646,424 | 7/1997 | Zhang et al. . |
| 5,654,203 | 8/1997 | Ohtani et al. . |
| 5,656,825 | 8/1997 | Kusumoto et al. . |
| 5,663,077 | 9/1997 | Adechi et al. ............................ 438/151 |
| 5,681,759 | 10/1997 | Zhang ........................................ 437/21 |
| 5,700,333 | 12/1997 | Yamazaki et al. . |

OTHER PUBLICATIONS

G. Liu et al., "Selective area crystallization of amorphous silicon films by low–temperature rapid thermal annealing," Appl. Phys. Lett., vol. 55, No. 7, Aug. 14, 1989, pp. 660–662.

R. Kakkad et al., "Low Temperature Selectivef Crystallization of Amorphous Silicon," Journal of Non–Crystalline Solids, vol. 115, 1989, pp. 66–68.

C. Hayzelden et al., "In Situ Transmission Electron Microscopy Studies of Silicide–Mediated Crystallization of Amorphous Silicon", (3 pages) Date Unknown.

A.V. Dvurechenskii et al., "Transport Phenomena in AMorphous Silicon Doped by Ion Implantation of 3d Metals", Akademikian Lavrentev Prospekt 13, 630090 Novosibirsk 90, USSR, pp. 635–640 Date Unknown.

T. Hempel et al., "Needle–Like Crsyatillization of Ni Doped Amorphous Silicon Thin Films", Solid State Communications, vol. 85, No. 11, pp. 921–924, 1993.

K. Kugiyama et al., "CW Laser Annealing of Polycrystalline Silicon on SiO2 and effects of Successive Furnace Annealing", J.J. Appl. Phys., vol. 21, No. 1, Jan. 1982.

FIG. 8

| NO. | SAMPLE FORMING CONDITION | SPIN DENSITY (spins/cm$^3$) | g VALUE |
|---|---|---|---|
| 1 | 560°C, 4h | 3.22 x 10$^{18}$ | 2.0055 |
| 2 | 550°C, 4h | 7.72 x 10$^{18}$ | 2.0055 |
| 3 | (550°C, 4h) + LC | 8.21 x 10$^{18}$ | 2.0057 |
| 4 | (550°C, 4h) + LC + (550°C, 4h) | 7.65 x 10$^{17}$ | 2.0051 |
| 5 | 600°C, 24h | 1.06 x 10$^{18}$ | 2.0052 |
| 6 | 600°C, 24h (Ni NOT ADDED) | 3.06 x 10$^{18}$ | 2.0049 |

HEATING TREATMENT AND LASER LIGHT IRRADIATION

IMPURITY ION INPLANTATION

HEATING TREATMENT

FIG. 12

| No. | EXPERIMENTAL CONDITIONS |
|---|---|
| 1 | 1/50 BHF |
| 2 | FPM |
| 3 | FPM + OZONE WATER |
| 4 | OZONE WATER + FPM |
| 5 | HYDROGEN PEROXIDE SULFATE + AMMONIA HYDROGEN PEROXIDE + HYDROGEN PEROXIDE HYDROCHLORIC ACID + 1/100 HF |
| 6 | HYDROGEN PEROXIDE SULFATE + FPM |
| 7 | OZONE WATER + BHF INCLUDING SURFACE ACTIVE AGENT |

FPM   $H_2O_2 : HF : H_2O = 0.5 : 0.5 : 99$

METHOD FOR PRODUCING SEMICONDUCTOR DEVICE

This application is a Divisional application of Ser. No. 08/496,529, filed Jun. 29, 1995.

BACKGROUND OF THE INVENTION

1. Field of the Invention

The present invention relates to a method for producing semiconductor device using a crystalline semiconductor.

2. Description of the Related Art

Thin film transistors (TFTs) using thin film semiconductors are known. These TFTs are constructed by using a semiconductor thin film on a substrate thereof. These TFTs are used in various integrated circuits. They are noted as a switching element particularly in an electro-optical device, and more particularly as a switching element provided in each pixel in an active matrix type liquid crystal display (LCD) device, and as a driver element formed in a peripheral circuit portion.

With semiconductors thin film used in the TFTs, an amorphous silicon film can be conveniently used. However, such silicon film has a problem in that the electric characteristics are low. To improve the characteristics of the TFTs, crystalline silicon thin films may be used. Crystalline silicon films are referred to as a polycrystalline silicon, polysilicon, fine crystal silicon or the like. To obtain such a crystalline silicon film, an amorphous silicon film may be formed first followed by heating the film to crystallize it.

However, there is a problem in that crystallization of the silicon film by heating requires a heating temperature of 600° C. or more and a heating time of 20 hours or more, a glass substrate can be used with great difficulty. For example, Corning 7059 glass has a glass skew point of 593° C. In consideration of the maximization of the substrate, heating the silicon film at 600° C. is problematic. In other words, when Corning 7059 glass substrate often used is heated at 600° C. or more for 20 hours or more, shrinkage and warp of the substrate become very conspicuous.

To solve the above problem, heating at the lowest possible temperature is required. On the other hand, heating process time is demanded to be shortened as much as possible to heighten the productivity.

When the amorphous silicon film is crystallized by heating, there arises a problem in that the whole silicon film is crystallized, which impedes partial crystallization of the substrate or a control of crystallization of a specific region of the substrate.

As a method for solving the above problem, Japanese Unexamined Patent Application No. HEI 2-140915 and Japanese Unexamined Patent Application No. HEI 2-260524 describe a technique for selectively crystallizing the substrate by artificially forming a portion or a region that will constitute a crystal nuclei in the amorphous silicon film followed by heating the substrate.

Japanese Unexamined Patent Application No. HEI 2-140915 describes a structure of crystal growth from this crystal nuclei by forming an aluminum layer on the amorphous silicon film and growing the crystal nuclei in a portion where this amorphous silicon contacts the aluminum followed by heating the silicon substrate. Further, Japanese Unexamined Patent Application No. HEI 2-260524 describes a structure for doping tin (Sn) into the amorphous silicon by the ion doping method to grow a crystal nuclei in a region into which tin ions are implanted.

However, Al and Sn are substitute metals which constitute an alloy with silicon so as not to diffuse into and intrude the silicon film. Then the portion of the metal which forms an alloy core together with silicon constitutes a crystal nuclei. The crystal is allowed to grow from that portion. When Al and Sn are introduced, the crystallization is characterized in that the crystal growth proceeds from the portion at which Al and Sn are introduced (an alloy layer of Al and Sn, and silicon). Generally, the crystallization proceeds in two stages; generation of an initial core and the crystal growth from the core. Al and Sn which are substituent metal elements with respect to silicon are effective in the generation of the initial core, but is hardly effective in the crystal growth after that.

Consequently, when Al and Sn are used, the temperature cannot be set to a low level compared with the crystallization of the amorphous silicon film by heating nor the heating time can be set to a short level. In other words, use of Al and Sn shows no remarkable superiority over the crystallization process of amorphous silicon film which is carried out by the conventional simple heating.

SUMMARY OF THE INVENTION

Studies conducted by the inventors of the invention have clarified the fact that an amorphous silicon film can be crystallized at 550° C. for about four hours by depositing a very small amount of elements such as nickel, paradium off the like which intrude silicon on a surface of the amorphous silicon film followed by heating the amorphous silicon film. In this case, crystal growth can be facilitated not only at the stage of generating the initial core but also at the stage after that with the result that the heating temperature can be largely lowered as compared with the conventional method based on heating, and the heating time can be shortened as well.

To introduce such a small amount of element as described above (such as metal elements for crystallization), after plasma treatment and vapor deposition is conducted, ion doping may be further used. Plasma treatment refers to a process for doping a metal element into amorphous silicon film in a parallel plane type plasma CVD system or a positive column type CVD system by using a material containing a metal element as an electrode and generating plasma in the atmosphere of nitrogen, hydrogen or the like.

As metal elements for accelerating the crystallization, invasive metals such as Fe, Co, Ni, Ru, Rh, Pd, Os, Ir, Pt. Cu, Ag, or Au can be used. These invasive metal elements diffuse into the silicon film in the heating process. Then silicon is crystallized at the same time when the above intrusive elements diffuse in the silicon film. In other words, crystallization of the amorphous silicon film is accelerated with catalysis action at places into which the intrusive elements diffuse.

Consequently, the crystallization can proceed with a method different from a method used in the case in which the crystallization gradually proceeds from the crystal nuclei. For example, when the substrate is heated after the above metal elements are introduced into a specific place of the amorphous silicon film, the crystallization proceeds in a direction parallel to the film plane from a region from which these metal elements are introduced. The length of the crystallization extends over tens of $\mu$m or more. In addition, when the above metal element is introduced into the entire surface of the amorphous silicon film, the entire film can be uniformly crystallized. It goes without saying that the entire film has a polycrystal or a fine crystal structure, but does not have a clear grain boundary at a specific place. Consequently, it is possible to form a device with uniform characteristics by using an arbitrary portion of the film.

Also, since the above intrusive elements soon diffuse into the silicon film, the amount of introduced elements (doped elements) becomes very important. In other words, when the doped amount is small, the effect of accelerating the crystallization is small, and no favorable crystallinity cannot be obtained. When the amount is too large, the semiconductor characteristics of silicon are lost.

Consequently, this means that the optimal amount of elements introduced into the amorphous silicon film exist. For example, it has been made clear that when nickel is used as a metal element which accelerates the above crystallization, the effect of accelerating the crystallization can be obtained at a density of $1 \times 10^{15}$ cm$^{-3}$ or more, and the semiconductor characteristics are not damaged at a density of $1 \times 10^{19}$ cm$^{-3}$ or less. The density here is defined by the minimum value obtained by SIMS (secondary ion mass spectrometer).

Further, with respect to the metal elements other than nickel described above, the effect can be obtained in the same concentration scope as nickel.

It is necessary to control the amount of the elements which accelerate the crystallization of the above nickel in the crystalline silicon film after crystallization (elements which accelerate the crystallization are referred to as metal elements) in the introduction of these elements into the amorphous silicon film to provide the optimal scope of density of these elements.

In the case of using nickel as a metal element, an amorphous film is formed, and a crystalline silicon film is made by implanting nickel by plasma treatment. Then the crystallization process was investigated in detail and the following points have been made clear.
(1) The density of nickel is high in a region where nickel is directly introduced.
(2) The density of nickel is high from a region where nickel is directly introduced to a tip portion of a region where the silicon crystal has grown in a direction parallel to the substrate.
(3) An indefinite number of pores are made in a region in which the density of nickel is high by the hydrofluoric acid treatment.

FIG. 10 shows an photograph taken with an optical microscope with respect to the above point (3). FIG. 11 schematically shows the photograph of FIG. 10. FIG. 11 corresponds to FIG. 10. The left side portion shown in the photograph of FIG. 10 is a portion from which nickel is directly introduced (corresponding to a region designated by reference numeral 801). In addition, the central portion (a region designated by reference numeral 803 in FIG. 11) is a region in which the silicon crystal has grown (as shown by an arrow 802 in FIG. 11) in a direction parallel to the substrate. Further, the right side region in FIG. 10 (corresponding to a region designated by reference numeral 805 in FIG. 11) is a region where silicon remain amorphous.

As apparent in FIG. 10, a linear region where an infinite number of pores are made exists between a region where silicon crystal has grown in a direction parallel to the substrate (corresponding reference numeral 803) and an amorphous region (corresponding to an arrow 805 in FIG. 11). This region is completely removed so that an pore is made. Then it has been made clear that this region (designated by numeral 804 in FIG. 11) is a tip portion of crystal growth where a high density of nickel is present.

Also, it has been confirmed under observation of expanded state shown in FIG. 10 that an infinite number of pores are made in a region where silicon crystal has grown in a direction parallel to the substrate designated by numeral 803 in FIG. 11.

The invention disclosed in this specification has been made in view of the above experimental facts. The crystalline silicon film that has been crystallized with the action of metal elements by heating is subjected to hydrofluoric acid treatment (needless to say, buffer acid may be used) so that a portion having a high density of metal elements present in the film is removed to provide the crystalline silicon film having a low density of metal elements in the film.

The invention is intended to provide a method for fabricating a crystalline thin film semiconductor with crystallinity formed by heat treatment at 600° C. or less using a metal element, the method satisfying at least one of the following requirements.
(1) The amount of the metal element is controlled for introduction into the substrate and the amount thereof is set to be the minimum thereof.
(2) The method is to be highly productive.
(3) To provide a high crystallinity which is still higher than the crystallinity obtained in heat treatment.
(4) The concentration of the metal element in the crystalline silicon film is minimized.

The present invention provides a crystalline silicon film by using the following means to satisfy the above objects.

A simple substance of the metal element which accelerates the crystallization of the amorphous silicon film in contact with the amorphous silicon film or a compound containing the above metal element is held so that the simple substance or the compound is subjected to heat treatment with the simple substance or the compound being contact with the above amorphous silicon film for crystallizing part or whole of the above amorphous silicon film. By using hydrofluoric acid, buffer acid or an etchant containing hydrofluoric acid at a concentration diluted to an appropriate level, the substrate is subjected to hydrofluoric acid treatment (etching treatment) to remove the localized (nickel is deflected to provide a higher density at localized region) metal element (which is thought to form a silicide with a metal at localized region) with the result that the density of the metal element is reduced in the film. Then pores (an infinite number of pores are formed as a result of the removal of silicide formed of localized metal and silicon) formed in the above etching process are eliminated to provide a silicon film excellent in crystallinity by irradiating the substrate with laser light or strong light. Further, with heat treatment after the irradiation of the substrate with laser light or strong light, the defect density in the film is reduced. The solvent to be used in the above hydrofluoric acid may be of any kind as long as silicon compounds can be etched. Needless to say, the solvent that can etch silicon itself cannot be used.

In the above structure, the substrate may be subjected to heat treatment without the irradiation thereof with laser light or strong light. Otherwise, the substrate may be irradiated with laser light or strong light without heat treatment. However, the combination of the laser light or strong light irradiation with annealing process by heating can yield a multiplier effect, which is extremely effective. That is, the irradiation of the substrate with laser light or strong light has the effect of eliminating pore portions (particularly, horizontal growth region (a region designated by numeral 803 in FIG. 11)) formed in the above etching process to provide a silicon film with a favorable crystallinity. The laser light or strong light irradiation also has the effect of reducing defects in the film by conducting heat treatment. Thus, a crystalline silicon excellent in crystallinity and having a few defects can be obtained.

As a method for introducing the metal element accelerating crystallization, a method is useful which comprises coating a solvent including the metal element on a surface of the amorphous silicon film. The use of this method facilitates the control of the amount of the metal element. The metal element may be introduced onto an upper surface or a lower surface of the amorphous silicon film. When the metal element is introduced onto the upper surface, a solvent containing the metal element is coated onto the amorphous silicon film after forming the amorphous silicon film. When the metal element is introduced onto the lower surface of the amorphous silicon film, a solvent containing the metal element is coated onto a base surface before forming the amorphous silicon film so that the metal element is held in contact with the base surface.

Additionally, it is useful to construct at least one electric junction such as a PN junction, a PI junction, an NI junction or the like of a semiconductor device by using a crystalline silicon film formed by using the invention disclosed in the specification of the invention. Such semiconductors include thin film transistors (TFTs), diodes, and optical sensors. It is also possible to form resistors and capacitors by using the invention.

In a method for coating a solvent containing an element which accelerates crystallization onto the amorphous silicon, aqueous solution, an organic solvent solution or the like can be used as a solution. The term "contain" in the above expression has the following two meanings; the metal element is included as a compound, and the metal element is contained in the solution by allowing it to be dispersed therein.

As a solvent containing the metal element, a solvent can be used which is selected from polar solvents such as water, alcohol, acid or ammonium.

When nickel is used as a catalyst and included in the polar solvent, nickel is introduced as a nickel compound. The nickel compound can be typically selected from nickel bromide, nickel acetate, nickel oxalate, nickel carbonate, nickel chloride, nickel iodide, nickel nitrate, nickel sulphate, nickel formate, nickel acetylacetate, 4-cyclohexyl nickel butyrate, nickel oxide and nickel hydroxide. In addition, as a solvent containing the metal element, a nonpolar solvent selected from benzene, toluene, xylene, carbon tetrachloride, chloroform, and ether can be used.

In this case, nickel is introduced as an nickel compound. The nickel compound can be typically selected from nickel acetylacetate, and nickel 2-ethylhexanoic acid.

Further, it is useful to use a surface active agent in a solution in which the metal element is contained. The purpose is to heighten adhesion with respect to the coated surface to control the adsorption thereof. This surface active agent may be coated in advance on a surface to be coated.

When the nickel simple substance is used as a metal element, nickel needs to be dissolved in acid to be a solution.

What is described above is an example in which a solution is used in which a metal element nickel is completely dissolved. Even if nickel is not completely dissolved, a material like emulsion may be used in which a powder comprising a nickel simple substance or a nickel compound is uniformly diffused in a diffusion catalyst. Otherwise, an oxide film forming solution may be used. As such a solution, OCD (Ohka Diffusion Source) manufactured by Tokyo Ohka Kogyo Co., Ltd. can be used. When the OCD solution is used, a silicon oxide film can be easily formed by coating the OCD solution on the substrate surface followed by baking it at about 200° C. Further, an impurity can be freely doped, so the impurity doping can be applied to the invention. In this case, a metal element may be contained in the oxide film. After the oxide film is provided in contact with an amorphous silicon film, the substrate is heated (at 350° C. to 400° C.) to diffuse the metal element into the amorphous silicon film. After the oxide film is removed, the substrate may be subjected to heat treatment for crystallization. The heat treatment for the crystallization may be performed at 450 to 600° C., for example 550° C. for about four hours.

By the way, the above procedure can be applied to a case in which materials other than nickel is used as the metal element.

As the metal element for accelerating crystallization, nickel is used. When a polar solvent such as water or like is used as a solution solvent for allowing nickel to be included in the substrate, a direct application of these solutions onto the amorphous silicon film often results in the repulsion of these solutions. In such a case, a thin oxide film is formed to a thickness of 100 Å or thinner, and then a solution containing the metal element is applied thereon with the result that the solution can be uniformly applied. In addition, a method for improving moist state is also effective by means of adding a material like a surface active agent or the like into the solution.

In addition, nonpolar solvent like a toluene solution of nickel 2-ethylhexanoic acid is used as a solution to be directly applied on a surface of the amorphous silicon film. In such a case, it is effective to apply a material such as an adhesive agent used in the coating of a resist. However, it is necessary to pay attention to the fact that when the coating amount is too large, doping of the metal element into the amorphous silicon is prevented.

The amount of the metal element included in the solution depends on the kind of solution. However, it is desirable that the general tendency is that the amount of nickel included in the solution is set to 1 ppm to 200 ppm, or preferably 1 ppm to 50 ppm (in weight). This is a value determined in view of the nickel density and resistance against fluoric acid.

The crystallinity of silicon film crystallized by heat treatment can be further heightened by the irradiation thereof with laser light followed by heat treatment. In addition, when partial crystallization is generated by heat treatment, crystal is further grown in that part by heat treatment thereby realizing a higher state of crystallinity.

As the laser light, pulse generating excimer laser light can be used. For example, KrF excimer laser (having a wave length of 248 nm), XeCl excimer laser (having a wave length of 308 nm), XeF excimer laser (having a wave length of 351 nm, and 353 nm), ArF excimer laser (having a wave length of 193 m) and XeF excimer laser (having a wave length of 483 nm) or the like can be used. Further as exciting methods, the discharge exciting method, the X ray exciting method, the light exciting method, the microwave discharge exciting method, and the electron beam exciting method can be used.

Further, in place of the laser light, strong light, particularly, a method using infrared rays can be adopted. Since the infrared rays are hardly absorbed by light, and can be easily absorbed by the silicon thin film, the silicon thin film formed on the glass substrate can be selectively heated so that the method is very useful. The method using the infrared rays is referred to as the Rapid Thermal Anneal (RTA), or the Rapid Thermal Process (RTP).

In the present invention, further heat treatment can be carried out in addition to the crystallization by the above laser light irradiation. The condition of the heat treatment may be the same as the heat treatment for crystallizing the amorphous silicon film. Needless to say the condition of the two heat treatment may not be completely the same. The heat treatment may be carried out at 400° C. or more.

Such heat treatment carried out after the laser light or strong light irradiation can reduce defects in the crystalline silicon film. FIG. 8 shows the result of the measurement of the spin density of the crystalline silicon film manufactured under the conditions described in the items of the specimen conditions when the spin density thereof is measured by the electron spin resonance (ESR) method. What is described in the items of the specimen conditions shown in FIG. 8 is heating temperature and heating time in the atmosphere of nitrogen. The symbol LC designates the laser light irradiation. Except for specimens described as "free of Ni" nickel is used as the metal element for crystallization. In addition, value g refers to an index representative of the position of spectrum, and g=2.0055 refers to a spectrum resulting from an dangling bond. Consequently, it is possible to understand that the spin density shown in FIG. 8 corresponds to the dangling bond in the film.

FIG. 8 shows that the spin density is the smallest in the case of the specimen 4 and the dangling bond in the film is the fewest in the film. This shows that the defects and the level in the film is the smallest. For example, when the specimen 3 is compared with the specimen 4, it is apparent that the spin density may be reduced by a factor of one tenth. In other words, it is shown that the defect and the level in the crystalline silicon film can be reduced by a factor of more than one tenth.

From a comparison between the specimen 2 and the specimen 3, the spin density hardly changes by irradiating the specimens with laser light. It means that the laser light irradiation has almost no effect in reducing defects in the film. However, analysis or the like of the film under light-transmitting type electronic microscope photography shows that effect of accelerating the crystallinity by laser irradiation is extremely high. Consequently, laser light irradiation is extremely effective for accelerating the crystallinity of crystalline silicon film that has been crystallized once by heating. Further, subjecting the film whose crystallinity has grown to heat treatment again is extremely effective in reducing the defects in the film. Thus, a silicon film with excellent crystallinity and low defect density in the film can be obtained.

By the way, in accordance with the present invention, the crystal can be selectively grown by selectively coating a solution containing the metal element. Particularly, in this case, the crystal can be grown on the surface of the silicon film in an approximately parallel direction from a region where the solution is coated to the a region where the solution is not coated. The region where the crystal has grown in ah approximately parallel direction on the silicon film surface is referred to as horizontally crystal grown region in this specification.

It is confirmed that the horizontally crystal grown region has a low concentration of the metal element. As an active layer region of the semiconductor device, use of the crystalline silicon film is useful. Consequently, forming the active layer region of the semiconductor device by using a region where the crystal has grown in the above horizontal direction is useful in the manufacture of the device.

The present invention can produce the most conspicuous effect when nickel is used as the metal element. Other kinds of metals that can be used preferably include Fe, Co, Ni, Ru, Rh, Pd, Os, Ir, Pt, Cu, Ag and Au.

The method of introducing the metal element is not limited to use of aqueous solution, alcohol or the like. Materials containing the metal element can be widely used For example, metal compounds and oxides containing the metal element can be used.

In the present invention, the step of laser light or strong light irradiation for increasing the crystallization ratio or the heat treatment step for reducing the defects in the film can be repeated alternately two or more times. Further, irradiating the substrate with laser light a plurality of times is also effective. In such a case, the irradiation energy density may be enlarged gradually for each laser light irradiation. For example, when the substrate is irradiated with laser light two times. A weak laser light is applied in the first time laser light irradiation, and then strong laser light may be applied in the second time laser light irradiation. By such a method, the effect of the residual metal component can be reduced.

By the action of the intrusive element which accelerates the crystallization, the amorphous can be crystallized in a short time at low temperature. Specifically, the crystalline silicon film can be obtained by about four hour heat treatment at 550° C. which has been impossible in the prior art. Also, since intrusive elements which intrude silicon accelerates crystallization while diffusing in the silicon film, the crystal growth is different from the crystal growth from the crystal nuclei. Thus crystalline silicon film having no clear grain boundary can be obtained.

The localized nickel silicide portion can be removed by subjecting to treatment using fluoric acid the crystalline silicon film crystallized by heating with the action of the metal element. In other words, it is possible to remove a region where the concentration of nickel has become locally high (nickel silicide is formed in this region). Then, the concentration of the metal element in the film can be lowered. Then by the laser light or strong light irradiation after the treatment using the fluoric acid, fine pores formed in the film can be removed. Then, by further heat treatment, the silicon film with small defects and high crystallinity can be obtained.

By the fluoric acid treatment, the concentration of the metal element in the film can be reduced by a factor of about one tenth or one hundredth. Even if the amount of introduced metal element is $1\times10^{15}$ to $1\times10^{19}$ cm$^{-3}$, the concentration of the metal element in the film can be set to $1\times10^{18}$ cm$^{-3}$ or less by the above treatment using fluoric acid. Further, the defects in the film can be reduced by laser light irradiation followed by further heat treatment. As an etchant for the fluoric acid treatment, generally used buffer acid may be used. However, it is more effective to use of FPM comprising a mixture of hydrofluoric acid and hydrogen peroxide and water. By the way, the concentration of the metal element in this specification is defined as a minimum value of concentration distribution obtained by SIMS (secondary ion mass spectrum).

Also, in the present invention disclosed in the specification, when crystallization by heating treatment using a metal element which promotes crystallization of silicon is performed, it is effective to set to a heating temperature equal to and greater than a crystallization temperature of an amorphous silicon film. In this state, a crystalline silicon film having extremely high crystallinity can be obtained at a short time.

However, if the heat resistance of a glass substrate is low, deformation of a substrate is remarkable. Therefore, although a cost becomes high, it is effective to use a glass substrate having high heat resistance and a quartz substrate.

Although a crystallization temperature of an amorphous silicon film changes in accordance with a forming method and a forming condition of the amorphous silicon film, generally, it is 580° C. to 620° C. Therefore, in this state, it is necessary to use a glass substrate having a distortion point of 620° C. or higher or a quarts substrate. Also, it is required that heating treatment is performed at a temperature equal to and smaller than a distortion point of a glass substrate and a quarts substrate which are to be used.

A method for further improving characteristics of a device by not only removal of a metal element but also removal of an organic substance includes a process using a solvent having strong oxidation such as ozone water and after this process an etching process using an etchant including hydrofluoric acid such as FPM. Such the etchant has high removal effect for an oxide.

In the processes, an organic substance and a metal element which are existed on a surface of an active layer become oxides by a solvent having strong oxidation, then by further etching removal for the oxides, an exposed surface of the active layer becomes a clean state. Therefore, it is effective to suppress generation of trap level due to an organic substance and a metal element. This is a remarkable effect in characteristics of the produced thin film. transistor.

BRIEF DESCRIPTION OF THE DRAWINGS

FIG. 8 shows a result of ESR measurement;

FIG. 12 shows different conditions of cleaning or etching process for the active layer;

DETAILED DESCRIPTION OF THE PREFERRED EMBODIMENTS

Embodiment 1

In Embodiment 1, a crystallization accelerating metal element is included in an aqueous solution to be coated on an amorphous silicon film followed by the crystallization by heating thereby removing the metal element localized in the silicon crystallized by buffer acid treatment. Further, by laser light irradiation, pores (defects) in the metal component portion that has been already removed is eliminated to provide a silicon film with small content density of the metal element and excellent crystallinity.

Referring to FIGS. 1A to 1D, a method for fabricating a semiconductor is explained up to the step of introducing the metal element (nickel is used). A substrate is Corning 7059 glass. The size of the substrate is 100 mm×100 mm.

Figure 1A:
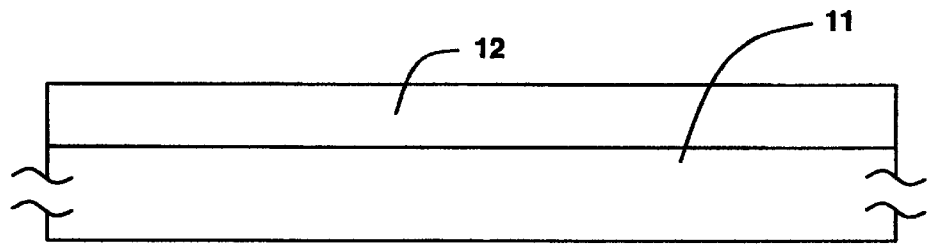
FIGS. 1A to 1D show the method for producing a semiconductor device according to an embodiment of the present invention.

The amorphous silicon film is treated by plasma CVD or the LPCVD to form an amorphous silicon film to a thickness of 100 to 1500 Å. The amorphous silicon film 12 is formed to a thickness of 1000 Å by plasma CVD. (FIG. 1A)

Figure 1B:
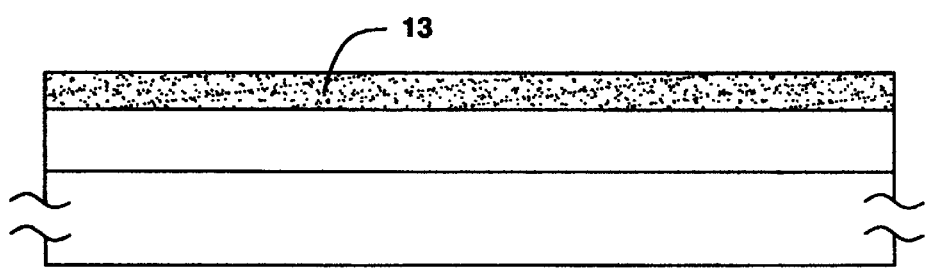

Then the silicon film is subjected to fluoric acid treatment to remove stains and a natural oxide film. Therefore, an oxide film 13 is formed to 10 to 50 Å. When the stain can be ignored, the natural oxide film may be used as it is in place of the oxide film 13. (FIG. 1B).

By the way, the oxide film 13 is extremely thin, and an accurate thickness of the film is not clear. However, it is thought that the thickness is about 20 Å. The oxide film 13 is formed by UV light irradiation in the atmosphere of oxygen. The film is formed by the 5 minute UV light irradiation. As a method for forming the oxide film 13, the thermal oxidation film may be used. Otherwise, the hydrogen peroxide may be used.

The oxide film 13 is used to allow an acetate solution to expand over the entire surface of the amorphous silicon film at step of coating the acetate solution containing nickel for the improvement of moisture characteristics. For example, when an acetate solution is directly coated on the surface of the amorphous silicon film, the amorphous silicon repulses the acetate solution. Thus nickel cannot be introduced onto the entire surface of the amorphous silicon film. That is, uniform crystallinity cannot be performed.

Figure 1C:
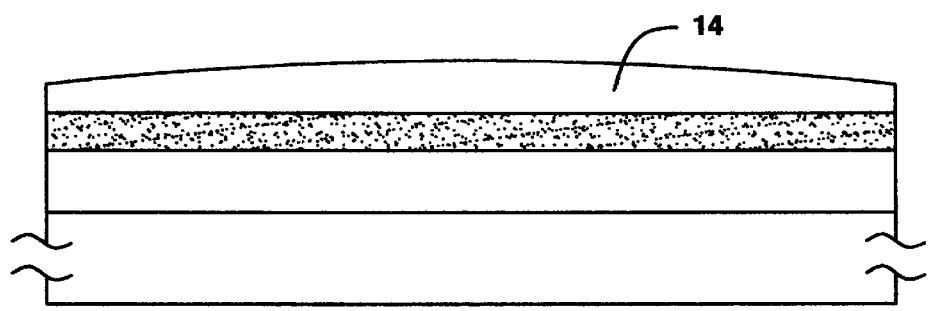
Figure 1D:
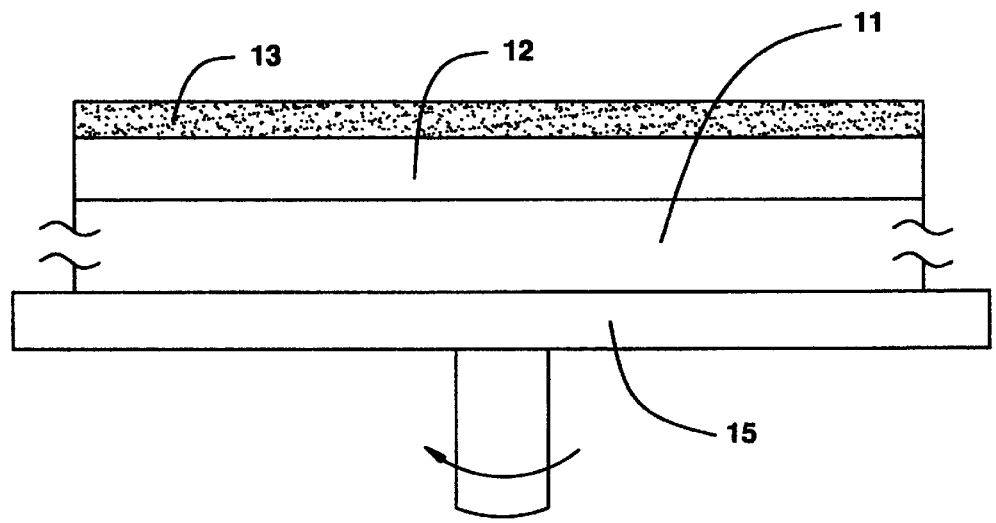

Then, the acetate solution is prepared which is doped with nickel. The concentration of nickel is 25 ppm. Then, 2 ml of the acetate solution is dropped on the surface of the oxide film 13 on the amorphous silicon film 12. This state is held for 5 minutes. Then a spinner is used to perform spin drying (2000 rpm and 60 seconds) (FIGS. 1C and 1D)

The density of nickel in the acetate solution is 1 ppm or more, and more preferably 10 ppm or more. When nonpolar solvent such as a toluene solution of nickel 2-ethylhexanoic acid is used, the oxide film 13 is not needed so that the metal element is introduced directly on the amorphous silicon film.

A layer containing nickel can be formed to an average thickness of several angstrom to hundreds of angstrom on the surface of the amorphous silicon film 12 after spin drying by carrying out the step of coating of this nickel solution once or a plurality of times. In this case, nickel in this layer is diffused in the subsequent heating process to act as a catalyst which accelerates crystallization. By the way, this layer is not necessarily a complete layer.

After coating of the above solution, the state is held for one minutes. The density of nickel which is finally included in the silicon film 12 can be controlled. The largest control factor is the concentration of the solution.

Then the heating furnace is used for four hour heating at 550° C. in the atmosphere of nitrogen. As a consequence, a crystalline silicon thin film 12 formed on the substrate 11 can be formed.

Although the above heat treatment can be carried out at 450° C. or higher, heating time should be longer at lower temperatures with the result that productivity is aggravated. In addition, when the heating temperature is 550° C. or higher, heat resistance of glass substrate used as the substrate is noted as a problem.

In this embodiment, a method for introducing the metal element on the surface of the amorphous silicon film, or introducing the metal element below the amorphous silicon film may be used. In the latter, before forming the amorphous silicon film, a solution containing a metal element is used to introduce the metal film on the base film.

Here, since nickel element is introduced onto the entire surface of the film, the crystal is grown on the entire surface of the film in a direction vertical relative to the substrate. When a crystalline silicon film 12 is obtained by heat treatment, the film is treated using 1/100 buffer acid. At this step, the localized nickel component (which exists as nickel silicide) in the film is removed. Here, by removing the nickel component, the nickel density in the film can be reduced. Then several shot of KrF excimer laser (having a wavelength of 248 nm and a pulse width of 30 nsec) is fired at a power density of 200 to 350 mJ/cm$^2$ in the atmosphere of nitrogen. The nickel component portion (having fine pores) removed at the previous step can be eliminated by the laser light irradiation.

The above step may be carried out by the infrared rays irradiation. At this step, expanding the pulse width of the excimer laser light is effective. This is because the melting time of the silicon film surface generated by the laser light irradiation can be prolonged and the crystal growth at fine portions can be accelerated.

This laser light irradiation further heightens the crystallinity of the silicon film and can eliminate fine pores generated at the step of treatment using buffer acid. Then, after the above laser light irradiation, four hour heat treatment is carried out at 550° C. in the atmosphere of nitrogen. This heat treatment may be carried out at 400° C. or higher. By heat treatment after laser light irradiation, defects in the silicon film can be reduced. Thus, it is possible to obtain a crystalline silicon film with small nitrogen concentration in the film, excellent crystallinity and small defects can be obtained.

Embodiment 2

Embodiment 2 is an example in which a 1200 Å thick silicon oxide film is selectively formed so that the silicon oxide film is used as a mask to selectively introduce nickel in accordance with the method for fabricating the semiconductor device according to Embodiment 1.

Figure 2A:
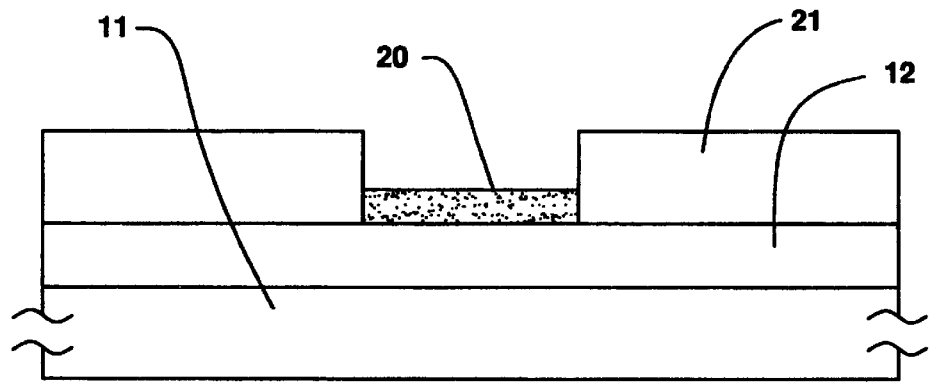
FIGS. 2A to 2C show the method for fabricating the semiconductor device according to the embodiment of the present invention.
Figure 2B:
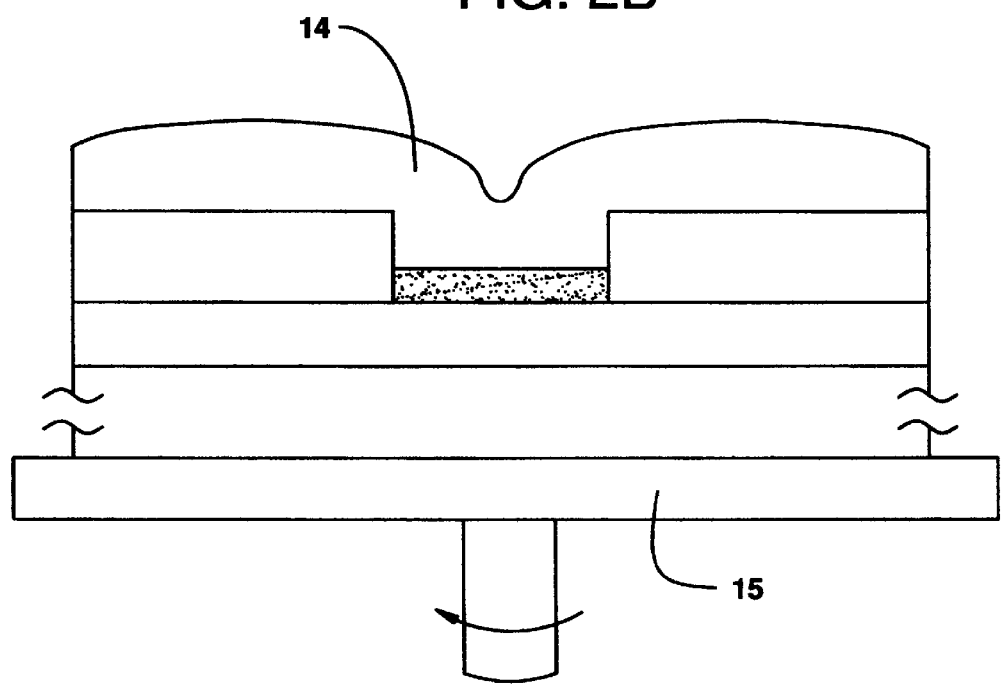
Figure 2C:
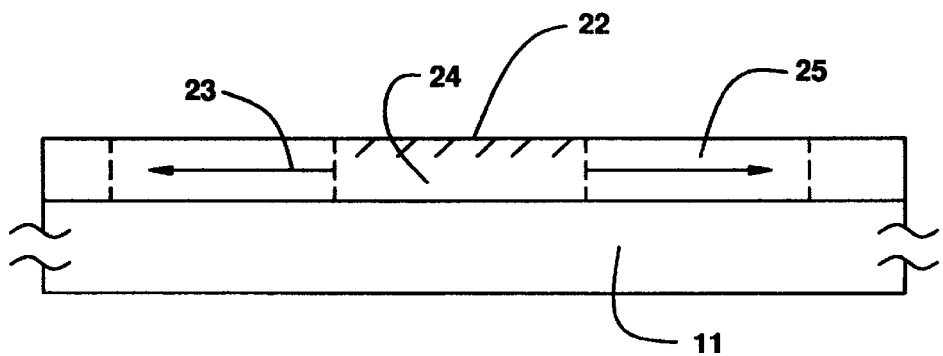

FIGS. 2A to 2C show an outline of the steps of fabricating the semiconductor according to Embodiment 2. In the beginning, on a glass substrate (Corning 7059, 10 cm square), a silicon oxide film 21 is formed to a thickness of 1000 Å or thicker, 1200 Å in this particular embodiment. It has been confirmed in the experiment conducted by inventors that the thickness of the silicon oxide film 21 can be 500 Å. It seems that if the film quality is fine, the thickness can be even thinner than that.

Then the silicon oxide film 21 is patterned to a necessary pattern by the normal photolithographic patterning process. Then a thin silicon oxide film 20 is formed by UV light irradiation in the atmosphere of oxygen. The thin silicon oxide film 20 is formed by five minutes UV light irradiation in the atmosphere of oxygen. By the way, it is thought that the thickness of the silicon oxide film 20 is about 20 to 50 Å. (FIG. 2A) By the way, with respect to the silicon oxide film for improving the moisture characteristics, when the solution agrees with the size of the pattern, nickel can be well added with the hydrophilic property of the mask silicon oxide film. However, such an example is specific. Generally, it is safe to use the silicon oxide film 20.

In such a state, like Embodiment 1, 5 ml of acetate solution containing 100 ppm of nickel is dripped, In addition, at this time, 10 sec spin coating is performed at 50 rpm with a spinner to form a uniform water screen over the entire surface of the substrate. Further, in this state, the substrate is held for five minutes followed by 60 sec spin drying at 2000 rpm by using a spinner. By the way, the substrate may be held while being rotated at 0 to 150 rpm over the spinner. (FIG. 2B)

Then, the amorphous silicon film 12 is crystallized by four hour heating at 550° C. (in the atmosphere of nitrogen). At this time, the crystal is grown as designated by reference numeral 23 in a horizontal direction from a region 22 where nickel is introduced to a region where nickel is not introduced. As shown in FIG. 2C, reference numeral 24 designates a region into which nickel is directly introduced for crystallizing the amorphous silicon film 12. Reference numeral 25 designates a region where crystallization thereof is performed in a horizontal direction. It has been confirmed that the crystal is grown approximately in the axial direction <111> in this region 25. In addition, it is also confirmed in the TEM photography (light transmitting type electronic microscope photography) that the crystal is grown in a column-like or a branch-like configuration in a direction parallel to the substrate.

After the crystallization process after the above heat treatment, 1/100 buffer acid is used to remove the localized crystal component. Although 1/100 buffer acid is used, the density may be appropriately determined. As an etchant used here, fluoric acid or a solution containing fluoric acid can be used. As the solution, a solution which enables etching silicon silicide or silicon oxide.

The XeCl excimer laser (having a wave length of 308 nm) is used to further improve the crystallinity of the silicon film 12. Pores (formed as a result of the removal of localized nickel silicide) formed in the previous etching process can be eliminated by the laser irradiation at this step. In other words, the surface of the silicon film is melted by the laser light irradiation to eliminate the pores. Further, at this step, by the previous heat treatment, the crystallization proceeds between columns or between branches in a portion where crystal is grown in a column-like or a branch-like configuration in a direction parallel to the substrate.

Further, it is effective to heat the substrate or a surface to be irradiated with laser light in the above laser light irradiation process. The substrate or the surface is preferably heated at about 200 to 450° C.

After the laser light irradiation, the substrate or the surface is heated for four hour at 550° C. in the atmosphere containing nitrogen to further reduce the defects in the film.

In Embodiment 2, by changing the solution density and holding time, the density of nickel in the region into which nickel is directly introduced can be controlled in $1 \times 10^{15}$ atoms cm$^{-3}$ to $1 \times 10^{19}$ atoms cm$^{-3}$. In the same manner, it is possible to control the density in a horizontal growth region to a level less than that.

The crystalline silicon film formed in the method shown in Embodiment 2 has a feature such that the film is favorable in resistance against fluoric acid. This is quite natural considering that the film is once subjected to the fluoric acid treatment.

For example, on the crystalline silicon film, a silicon oxide film is formed which functions as a gate insulating film or an interlayer insulator. After that, it is sometimes necessary to form an electrode through a step of forming pores. In such a case, a step of removing the silicon oxide film with buffer acid is normally adopted. However, when the crystalline silicon film has a low resistance against fluoric acid, it is difficult to remove only the silicon oxide film. So there arises a problem in that even the crystalline silicon is etched.

However, in case that the crystalline silicon film has a resistance against fluoric acid, a difference in the etching rate (selection ratio) between the silicon oxide film and the crystalline silicon film can be largely taken with the result that only the silicon oxide film can be selectively removed which is extremely significant in the method for fabricating semiconductors.

Since the region where the crystal is grown in a horizontal direction has a small density of the metal element and a favorable crystallinity, use of the region as an active region of the semiconductor device is very useful. For example, use of the regions as a channel formation region of TFTs is extremely useful.

Embodiment 3

Embodiment 3 is an example in which a TFT is obtained by using a method of the invention. The TFT of Embodiment 3 can be used in a driver circuit or a pixel portion in an active matrix type liquid crystal display apparatus. By the way, it goes without saying that the application scope of the TFT can be applied not only to the liquid crystal display device but also to generally called TFT integrated circuit.

FIGS. 3A to 3E show the steps of fabricating the semiconductor according to Embodiment 3. A base silicon oxide film (not shown) is formed to a thickness of 2000Å. This silicon oxide film is provided to prevent an impurity from diffusion.

Then, an amorphous silicon film is formed to a thickness of 500 Å in the same manner as Embodiment 1. Then after the fluoric acid treatment for removing natural oxide film, a thin oxide film is formed to a thickness of about 20 Å by the UV light irradiation in the atmosphere of oxygen. This method for fabricating the thin oxide film may be a method comprising carbon peroxide treatment or thermal oxidation.

Then an acetate solution containing 10 ppm of nickel is coated, and the film is held for five minutes to perform spin drying by using a spinner. After that, the silicon oxide films 20 and 21 are removed by buffer acid followed by crystallization of the silicon film by four hour heat treatment at 550° C. (Up to this step, the method is the same as the fabricating method shown in Embodiment 1).

By the heat treatment, a silicon film containing a mixture of amorphous component and crystal component can be obtained. This crystal component is a region where the crystal nuclei exists. After that, 1/100 buffer acid is used for the fluoric acid treatment. Further, pores generated by the fluoric acid treatment are eliminated and the crystallinity of the silicon film is accelerated by the KrF excimer laser light irradiation at 200 to 300 mJ. At laser light irradiation, the substrate is heated to about 400° C. Through this process, the crystal is grown by using as a core the crystal nuclei present in the crystal component.

Figure 3A:
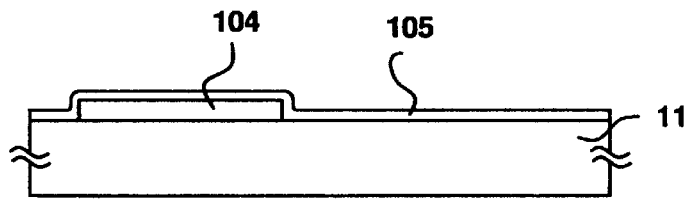
FIGS. 3A to 3E show the method for fabricating the semiconductor device according to the embodiment of the present invention.

The crystallized silicon film is patterned to form an island shaped region 104. The island shaped region 104 constitutes an active layer of the TFT. Then, a silicon oxide film 105 of from 200 to 1500 Å, for example, 1000 Å here is formed. This silicon oxide film also serves as a gate insulating film. (FIG. 3A)

Attention needs to be paid in the fabrication of the above silicon oxide film 105. Here, TEOS is used as a material to be decomposed and deposited at a substrate temperature of 150 to 600° C., or preferably 300 to 450° C. by the RF plasma CVD. The pressure ratio of TEOS and oxygen is set to 1:1 to 1:3. Besides, the pressure is set to 0.05 to 0.5 Torr, and RF power is set to 100 to 250 W. Otherwise, the TEOS is used together with ozone gas as a material to form the silicon oxide film by the reduced pressure CVD and the atmospheric pressure CVD at the substrate temperature of 350 to 600° C., or preferably 400 to 550° C. After the formation of the silicon oxide film, the film is subjected to 30 to 60 minutes annealing at 400 to 600° C. in the atmosphere of oxygen or ozone.

In this state, the crystallization of the silicon region 104 may be accelerated by the KrF excimer laser (having a wave length of 248 nm and a pulse width of 20 nsec) or strong light irradiation. Particularly, in the RTA (Rapid Thermal Annealing using infrared rays), only silicon can be selectively heated without heating the glass substrate. In addition, since an interface level at the interface between the silicon and the silicon oxide film can be reduced, the method is useful in the fabrication of an insulating gate field effect semiconductor device.

After the above laser light irradiation, the silicon oxide film is subjected to four hour heat treatment at 550° C. in the atmosphere of nitrogen.

Figure 3B:
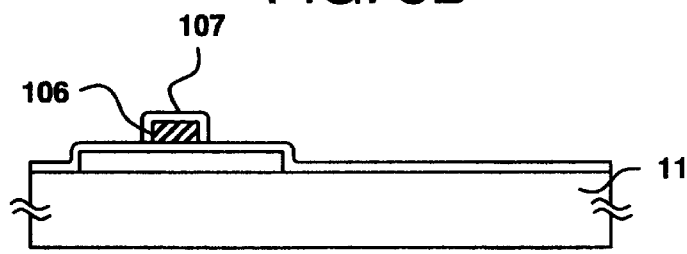

An aluminum film having a thickness of 2000 Å to 1 $\mu$m is formed with the electron beam vapor deposition process followed by patterning the film to form a gate electrode 106. The aluminum film may be doped with 0.15 to 0.2 wt % of Sc. Then the substrate is soaked in an ethylene glycol solution containing 1 to 3% of tartaric acid having a pH of about 7. With platinum constituting a cathode, gate electrode of the aluminum constituting an anode, the anode is oxidized. In the anode oxidation, the voltage is raised to 220 V in the beginning at a constant current, and the state is held for one hour thereby completing the anodic oxidation. In Embodiment 3, an appropriate voltage rise velocity is 2 to 5 V/min. under the condition of rated current. In this manner, the anode oxide 107 is formed to a thickness of 1500 to 3500 Å, for example, 2000 Å. (FIG. 3B)

By the ion doping (also referred to as plasma doping), impurity (phosphorus) is doped into an island shaped silicon film of the TFT in self-alignment using the gate electrode portion as a mask. A doping gas is phosphine ($PH_3$). The dose is 1 to $4 \times 10^{15}$ $cm^{-2}$.

Figure 3C:
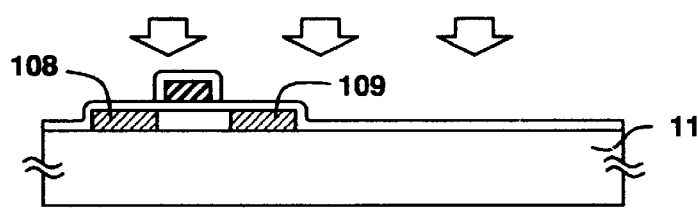

As shown in FIG. 3C, the KrF excimer laser (having a wave length of 248 nm and a pulse width of 20 nsec) is irradiated to improve the crystallinity in a portion when the crystallinity is deteriorated by the introduction of the above impurity region. The energy density of the laser is 150 to 400 $mJ/cm^2$, or preferably 200 to 250 $mJ/cm^2$. In this manner, an N-type impurity (phosphorus) regions 108 and 109 are formed. The sheet resistance in these regions are 200 to 800Ω/square.

At this step, in place of the laser light, strong light having the same strength as the laser light may be used with the adoption of the rapid thermal annealing (RTA) or the rapid thermal process (RTP) by which a flash lamp is used to raise the temperature to 1000 to 1200° C. (temperature of silicon monitor) in short time to heat the specimen.

Figure 3D:
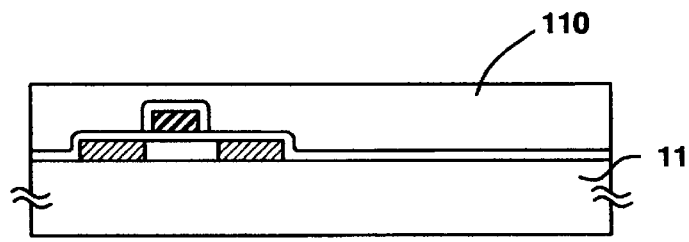
Figure 3E:
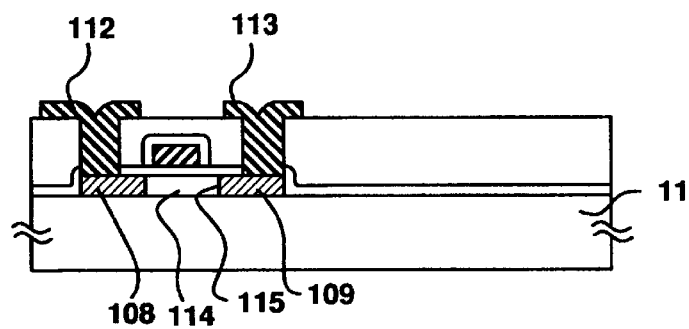

After that, a silicon oxide film is formed to a thickness of 3000 Å as an interlayer insulator 110 over an entire surface thereof by plasma CVD using the TEOS as a material together with oxygen, or low pressure CVD or the atmosphere pressure CVD using TEOS together with ozone. The substrate temperature is 250 to 450° C., for example, 350° C. After the film is formed, the silicon oxide film is mechanically ground to planarize the surface. (FIG. 3D).

Then the interlayer insulator 110 is etched as shown in FIG. 1E to form a contact hole in the source/drain of the TFT followed by forming Cr wiring 112 and 113 with Cr or Ti nitride.

Since the crystalline silicon film to which nickel is introduced by using the plasma treatment has a low selectivity to buffer acid compared with the silicon oxide, the crystalline silicon oxide film is often etched at the step of forming the above contact hole.

However, when nickel is introduced by using an aqueous solution in a low concentration of 10 ppm as seen in Embodiment 3, the above contact hole can be formed safely with good reproductivity due to high resistance against fluoric acid.

The silicon oxide film is annealed for one to two hours at 300 to 400° C. in hydrogen to complete the hydrogenation of silicon. In this manner, the TFT is completed. Then a plurality of TFTs fabricated at the same time are arranged in a matrix like configuration to complete an active matrix type liquid crystal display device. This TFT has source/drain regions 108/109 and a channel formation region 114. Besides, reference numeral 115 designates an NI electric contact portion.

When the structure of Embodiment 3 is adopted, it is thought that the density of nickel present in the active layer is about $3\times10^{18}$ atoms cm$^{-3}$ or about $1\times10^{15}$ atoms cm$^{-3}$ to $3\times10^{18}$ atoms cm$^{-3}$.

In the TFT of Embodiment 3, the mobility in the N-channel is 150 cm$^2$/Vs or more. Besides, it has been confirmed that the TFT has a small $V_{th}$ and favorable characteristics. Further, it has been confirmed that the variations of the mobility is ±10% or less. It is thought that such a small variation in the mobility results from the incomplete crystallization by heat treatment and acceleration of crystallinity by the laser light irradiation. When only the laser light is used, the mobility of 150 cm$^2$/Vs or more can be easily obtained in the N-channel. However, the variation is so large that it is impossible to obtain such a uniform mobility like Embodiment 3.

Embodiment 4

In Embodiment 4, there is shown an embodiment in which an electronic device is formed by selectively introducing nickel as shown in Embodiment 2 and by using a region where a crystal is grown in a horizontal direction (parallel to the substrate) from the portion where nickel is introduced. When such a structure is adopted, the density of nickel in the active layer region of the device can be further lowered so that an extremely favorable structure can be obtained in terms of electric stability of the device and the reliability thereof.

FIGS. 4A to 4F show the steps of fabricating the semiconductor device according to Embodiment 4. In the beginning, the substrate 201 is cleaned, and a base film 202 comprising a silicon oxide having a thickness of 2000 Å by plasma CVD using as a material gas TEOS (tetra ethoxy silane) and oxygen is formed. Then by plasma CVD, an intrinsic (I-type) amorphous silicon film 203 having a thickness of 500 to 1500 Å, for example, 1000 Å is formed. Then in a consecutive manner, a silicon oxide film 205 having a thickness of 500 to 2000 Å, for example, 1000 Å is formed by the plasma CVD. Then the silicon oxide film 205 is selectively etched to form a region 206 where the amorphous silicon is exposed.

Then, by the method shown in Embodiment 2, a solution (acetate solution in this case) is coated which contains nickel which is a metal element accelerating the crystallization. The density of nickel in the acetate solution is 100 ppm. Further, detailed orders at each step and conditions are the same as the method shown in Embodiment 3 or 4.

Figure 4A:
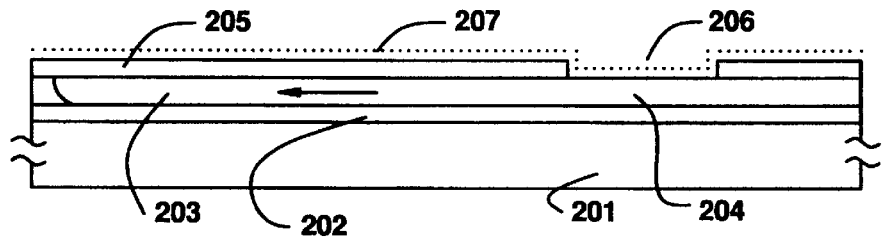
FIGS. 4A to 4F show the method for fabricating the semiconductor device according to the embodiment of the present invention.

After that, four hour annealing at 500 to 620° C., for example, 550° C. in the atmosphere of nitrogen is performed to crystallize the silicon film 203. In the crystallization, the crystal grows starting from a region 206 where nickel and the silicon film contact each other in a direction parallel to the substrate as shown by an arrow. A region 204 refers to a region into which nickel is directly introduced for crystallization, a region 203 refers to a region where the crystallization proceeds in a horizontal direction. The horizontally grown crystal designated by numeral 203 has a size of about 25 μm. Further, it has been confirmed that the direction of crystal growth is approximately <111> axial direction. (FIG. 4A)

After the crystallization by the above heat treatment, the fluoric acid treatment is performed using 1/100 buffer acid. The infrared rays irradiation accelerates annealing of pores generated in the fluoric acid treatment (portion where the localized nickel component (nickel silicide) is removed) and crystallinity of the silicon film 203. This step is performed by the irradiation of the infrared rays having a wavelength of 1.2 μm. This step provides the same effect as several minutes high temperature heat treatment.

As a light source of infrared rays, a halogen lamp is used. The intensity of the infrared rays is adjusted so that the temperature on a single crystal silicon wafer of the monitor ranges between 900 to 1200° C. The temperature of a thermo-couple embedded in the silicon wafer is monitored to be fed back to the light source of the infrared rays. In Embodiment 4, the temperature rises at a constant velocity of 50 to 200° C./sec, and the temperature falls through natural cooling to 20 to 100° C. In the infrared rays irradiation, the silicon film is selectively heated so that the heating of the glass substrate is minimized.

The silicon film is subjected to four hour heat treatment at 550° C. in the atmosphere of nitrogen to reduce defects in the film. Then the silicon oxide film 205 is removed. At this time, the oxide film formed on the surface of the region 206 is removed at the same time. Then after the silicon film 204 is patterned, the film is subjected to dry etching to form an island shaped active layer region 308. At this time, the region designated by reference numeral 206 in FIG. 4A is a region into which nickel is directly introduced though the nickel component is removed. This is also the region where nickel is present in a relatively high density. Besides, it is confirmed that nickel is present in a relatively high density. It is made clear that the concentration of nickel is high as compared with the intermediate region. Consequently, in this embodiment, these regions having a high density of nickel does not overlap a channel formation region at an active layer 208. This enables using a highly crystalline region with a small density of nickel as an active layer of the device.

Figure 4B:
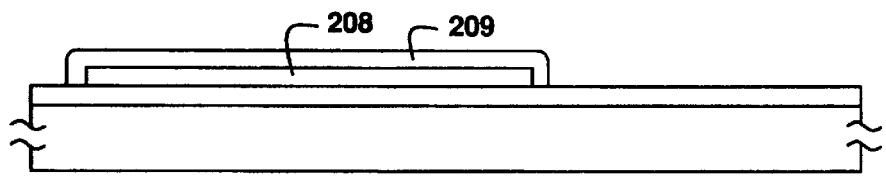

After that, the silicon film is left for one hour in an atmosphere having 10 atm pressure and a temperature of 500 to 600° C., typically 550° C. and containing 100 vol % of water vapor thereby oxidizing the surface of the active layer (silicon film) 308 to form a silicon oxide film 209. The thickness of the silicon oxide film is set to 1000 Å. After the silicon oxide film 209 is formed by thermal oxidation followed by holding the substrate at 400° C. in the atmosphere of ammonium (1 atm pressure, 100%). Then, in this state, the substrate is irradiated with infrared rays having a peak wave length of 0.6 to 4 μm, for example 0.8 to 1.4 μm for 30 to 180 seconds to subject the silicon oxide film 209 to nitridizing treatment. By the way, 0.1 to 10% of HCL may be mixed in the atmosphere at this time. (FIG. 4B).

Figure 4C:
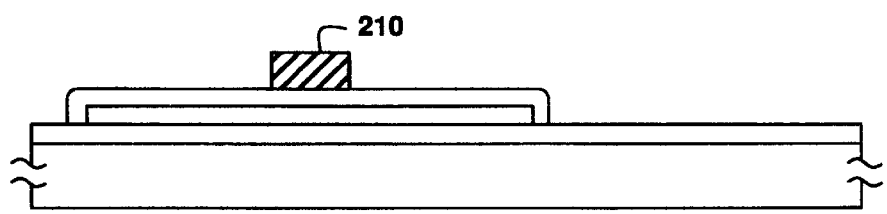

Successively, aluminum (including 0.01 to 0.2% of Sc) is formed by sputtering into a film having a thickness of 3000 to 8000 Å, for example, 6000 Å. Then, the aluminum film is patterned to form a gate electrode 210. (FIG. 4C)

Figure 4D:
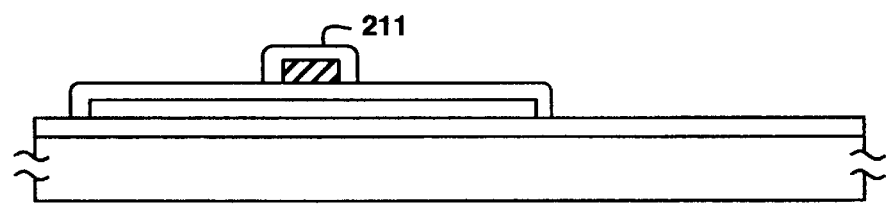

The surface of the aluminum electrode is anodized so that the oxide layer 21 is formed on the surface thereof. This anodic oxidation is carried out in an ethylene glycol solution containing 1 to 5% of tartaric acid. The thickness of the resulting oxide layer 211 is 2000 Å. By the way, since this oxide layer 21 constitutes a thickness for forming an offset gate in the subsequent ion doping, the length of the offset gate region can be determined in the above anodic oxidation. (FIG. 4D)

An N-conductive type imparting impurity (phosphorus) is doped in self-alignment into an active layer region (constituting a source/drain, and a channel) by the ion doping (also referred to as the plasma doping) using a gate electrode part, that is, a gate electrode 210 and an oxide layer 211 provided in the peripheral of the gate electrode as masks. A doping gas is phosphine (PH$_3$), and the acceleration voltage is 60 to 90 kV, for example, 80 kV. The dose is $1\times10^{15}$ to $8\times10^{15}$ cm$^{-2}$, for example, $4\times10^{15}$ cm$^{-2}$. As a result, N-type impurity regions 212 and 213 are formed. The impurity region and the gate electrode are separated by a distance of X to be placed in an offset state. Such an offset state is effective in the reduction of a leak voltage (also referred to as an off current), particularly, at the application of a reverse voltage (minus voltage in the case of N-channel TFT) to the gate electrode. Particularly, in a TFT in which an active matrix pixel is controlled as in Embodiment 4, since it is desired that the leak current is low so that an electric charge accumulated in a pixel electrode does not escape in order to provide a favorable image, it is effective to provide an offset.

Figure 4E:
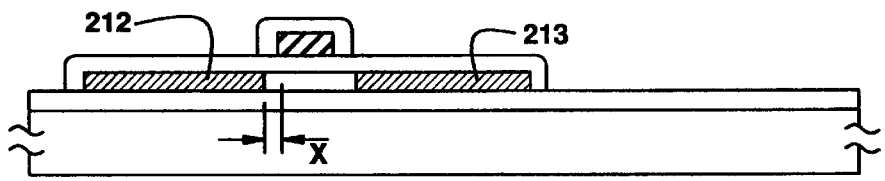

After that, the substrate is annealed by the laser light irradiation. As the laser light, KrF excimer laser (having a wavelength of 248 nm and a pulse width of 20 nsec) is used, but other laser light may be used. The laser light irradiation conditions is defined as follows; the energy density is 200 to 400 mJ/cm$^2$, for example, 250 mJ/cm$^2$. One place is irradiated with two to ten shots of laser light, e.g., two shots of laser light irradiation. At the time of the laser light irradiation, the effect of the laser light irradiation can be enhanced by heating the substrate at 200 to 450° C. (FIG. 4E)

Following that, a 6000 Å thick silicon oxide film 214 is formed as an interlayer insulator by plasma CVD. Further, a transparent polyimide film 215 is formed by the spin coating process to planarize the surface.

Figure 4F:
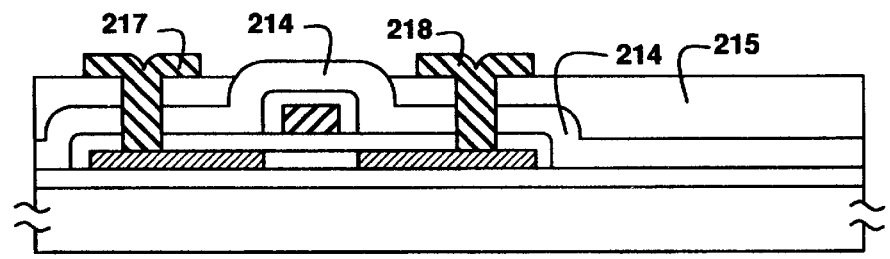

Then, a contact hole is formed in interlayer insulators 214 and 215, and the electrode and wiring 217 and 218 of the TFT are formed with a multilayer film of metal materials such as titanium nitride and aluminum. Finally, the substrate is subjected to 30 minutes annealing at 350° C. in the atmosphere of 1 atm pressure of water vapor to form an active matrix pixel circuit having a TFT. (FIG. 4F)

Since the TFT fabricated in Embodiment 4 can obtain a high mobility, the TFT can be used for a driver circuit in an active matrix liquid crystal display device.

Embodiment 5

FIGS. 5A to 5D show a cross section of a semiconductor fabricated in the method according to Embodiment 5. In the beginning, a silicon oxide base film 502 having a thickness of 2000 Å is formed on a substrate (Corning 7059) 501 by the sputtering process. After the substrate is subjected to annealing at a temperature higher than the skewing temperature before or after the formation of the base film, the substrate is gradually cooled to a temperature less than the skewing temperature at 0.1 to 1.0° C./min. Then, the shrinkage of the substrate at the following steps (including thermal oxidation process and thermal annealing of the present invention) accompanied by a rise in temperature is small, mask mating is required. The Corning 7059 substrate is subjected to one to four hour gradual annealing at 620 to 660° C. at 0.03 to 1.0° C./min., preferably 0.1 to 0.3° C./min. The substrate may be taken out when the temperature falls to 400 to 500° C.

Figure 5A:
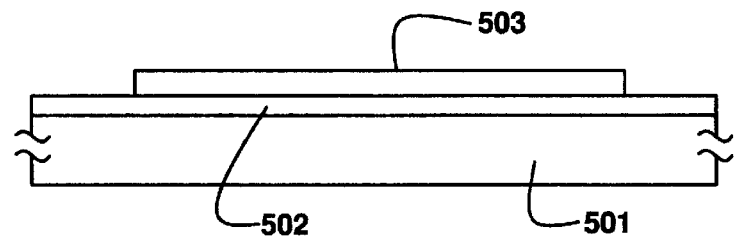
FIGS. 5A to 5D show the method for fabricating the semiconductor device according to the embodiment of the present invention.

Next, an intrinsic (I-type) amorphous silicon is formed to a thickness of 500 to 1500 Å, for example 1000 Å. Then by the method shown in Embodiment 1, as a metal element which accelerates crystallization, nickel is introduced onto the surface of the amorphous silicon film. Then the substrate is subjected to four hour annealing at 550° C. in the atmosphere of nitrogen (atm pressure) for crystallization. Then, 1/50 buffer acid is for the fluoric acid treatment by which nickel component (nickel silicide) localized in the film is removed. Then, the KrF excimer laser is irradiated to further accelerate crystallization. Then, the substrate is subjected to four hour heat treatment at 550° C. in the atmosphere of nitrogen. Then, the silicon film is patterned to a size of 10 to 1000 μm square to form an island shaped silicon film 503 (the active layer of the TFT) (FIG. 5A)

After that, one atmosphere pressure oxygen atmosphere including 70 to 90% of water vapor is formed at 500 to 750° C., typically 600° C. by the pyrogenic reactive process at a rate of hydrogen/oxygen=1.5 to 1.9. The substrate is left in such atmosphere for three to five hours to oxidize the surface of the silicon film thereby forming a silicon oxide film 504 to a thickness of 500 to 1500 Å, for example, 1000 Å. What should be noted is the fact that the surface of the initial silicon film is reduced by 50 Å or more with the result that stains on the top surface portion of the silicon film does not reach an interface of silicon and silicon oxide. That is, a clean interface of silicon and silicon oxide can be obtained. Since the thickness of the silicon oxide film is twice as thick as that of the silicon film that is oxidized. Consequently, when the silicon oxide film having a thickness of 1000 Å is oxidized to obtain a 1000 Å thick silicon oxide film, the thickness of the residual silicon film is 500 Å.

Generally, with reduced thickness the silicon oxide film (gate insulating film) and an active layer provides more favorable characteristics such as improved mobility and reduced off current. On the other hand, the crystallization of the initial amorphous silicon film is easier with increased thickness. Consequently, heretofore, the thickness of the active layer is inconsistent in terms of characteristics and process. The invention solves this problem for the first time. That is, before the crystallization, the amorphous silicon film is thickly formed to provide a favorable crystalline film. Then the silicon film is thinned through oxidation to improve the characteristics as the TFT. Further, the TFT has a feature in that the amorphous component, or a grain boundary which is likely to exist in the recombination center is likely to be oxidized so that the recombination center in the active layer is reduced. Thus, the yield ration of products is increased.

Figure 5B:
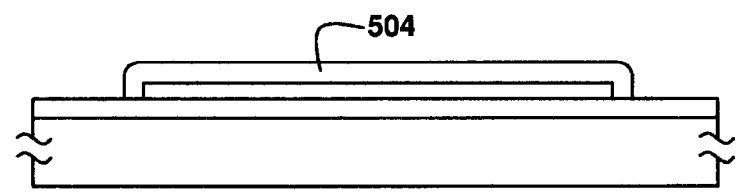

After the silicon oxide film 504 is formed by thermal oxidation, the substrate is annealed for 2 hour at 600° C. in the atmosphere of dinitrogen monoxide (one atm pressure, 100 %). (FIG. 5B)

Following that, a polycrystal silicon (including 0.01 to 0.2% of phosphorus) is formed into a film having a thickness of 3000 to 8000 Å, for example, 6000 Å by the low pressure CVD. Then the silicon film is patterned to form a gate electrode 505. Then the silicon film is used as a mask to dope in self-alignment by the ion doping (also referred to as plasma doping) an N-conductive type imparting impurity (phosphorus in this case) to an active layer region (constituting a source/drain and a channel). As a doping gas, phosphine ($PH_3$) is used. The acceleration voltage is 60 to 90 kv, for example, 80 kV. The dose is $1\times10^{15}$ to $8\times10^{15}$ cm$^{-2}$, for example $5\times10^{15}$ cm$^{-2}$. As a consequence, N-type impurity regions 506 and 507 are formed.

Figure 5C:
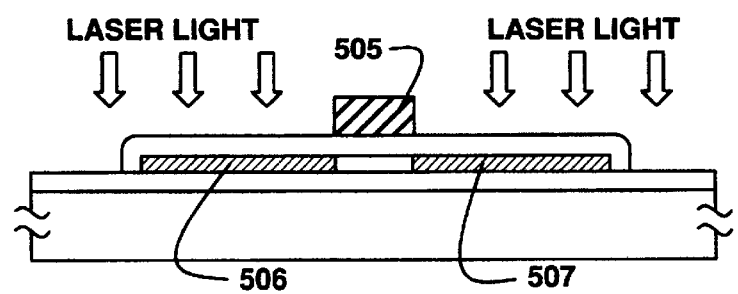

After that, the substrate is annealed by the laser light irradiation. As the laser light, KrF excimer laser (having a wave length of 248 nm and a pulse width of 20 nsec). However, other kind of laser light may be used. The laser light irradiation condition may be defined as follows; the energy density is 200 to 400 mJ/cm$^2$, for example 250 mJ/cm$^2$. One place is irradiated with two to ten shots of laser light. The effect may be enhanced by heating the substrate to 200 to 450° C. at laser light irradiation. (FIG. 5C)

In addition, the process may be performed by lamp annealing using near infrared rays. The near infrared rays can be more easily absorbed by crystalline silicon than by amorphous silicon so that an effective annealing can be carried out which is comparable to thermal annealing at 1000° C. or higher. On the other hand, the near infrared rays are hardly absorbed by the glass substrate (while the far infrared rays are absorbed by the glass substrate but the visible or near infrared rays (having a wave length of 0.5 to 4 μm) are not absorbed) so that the glass substrate is not heated to a high temperature. In addition, the process can be completed in a short time. In addition, the method is the most appropriate at the step where the shrinkage of the glass substrate poses a problem.

Figure 5D:
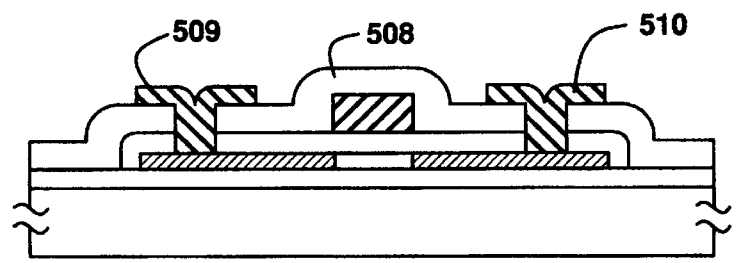

Following that, a silicon oxide film 508 having a thickness of 6000 Å is formed as an interlayer insulator by plasma CVD. As the interlayer insulator, a polyimide may be used. Further, a contact hole is formed to form the electrode/wiring 509 and 510 of the TFT of a metal material multilayer such as titanium nitride and aluminum. Finally, the substrate is subjected to 30 minutes annealing at 350° C. in an atmosphere of one atm pressure water vapor thereby completing the TFT. (FIG. 5D)

The mobility of the TFT obtained in the above method is 110 to 150 cm$^2$/Vs, and S value is 0.2 to 0.5 V/digit. In addition, when a P-type TFT is fabricated by doping boron to the source/drain in the same method, the mobility is 90 to 120 cm$^2$/Vs and S value is 0.4 to 0.6 V/digit. When the case is compared with a case in which the gate insulating film is formed by the known PVD and the CVD, the mobility is reduced by 20% and S value is reduced by 20% or more.

In reliability, the TFT in Embodiment 5 shows a favorable result which is comparable to the counterpart of that TFT fabricated by high temperature thermal oxidation at 1000° C.

Embodiment 6

FIGS. 6A to 6F are a cross section of a semiconductor fabricated in Embodiment 6. The TFT shown in Embodiment 6 refers to a TFT arranged in a pixel portion in an active matrix type liquid crystal display device.

A 2000 Å thick silicon oxide base film 52 is formed on the substrate (Corning 7059) 51. Further, an amorphous silicon film is formed to a thickness of 200 to 1500 Å. An intrinsic (I-type) amorphous silicon film is formed to a thickness of 800 Å. A metal element nickel is introduced according to a method in Embodiment 1, followed by four hour heat treatment at 550° C. in the atmosphere of nitrogen thereby transforming the silicon film into a crystalline film. Then 1/70 buffer acid is used to subject the substrate to the fluoric acid treatment to remove nickel component localized in the film. Then, the crystallinity of this crystalline silicon film is further accelerated by the KrF excimer laser light irradiation. Further, the substrate is subjected to four hour heat treatment at 550° C. in the atmosphere of nitrogen.

The crystalline silicon film thus obtained can be a crystalline silicon film where no clear grain boundary exist in a specific region. At an arbitrary place of the surface, an active layer of the TFT can be formed. That is, since the whole film is uniformly crystallized, the entire crystalline silicon film which constitutes the active layer of the TFT can be made uniformly even in the case where the TFT is formed in a matrix configuration. As a consequence, a large number of TFTs with small variation in characteristics can be obtained. In addition, nickel component in the film can be made extremely small with the result that the stability of devices can be heightened.

Then, an island shaped region 53 comprising a crystalline silicon is formed by patterning the substrate. Then a 1000 Å thick silicon oxide film 54 is formed to cover the island shaped region. There is shown hereinbelow a case in which one TFT is formed by using FIG. 6. In actuality, TFTs are simultaneously formed in the number required for the matrix configuration.

Figure 6A:
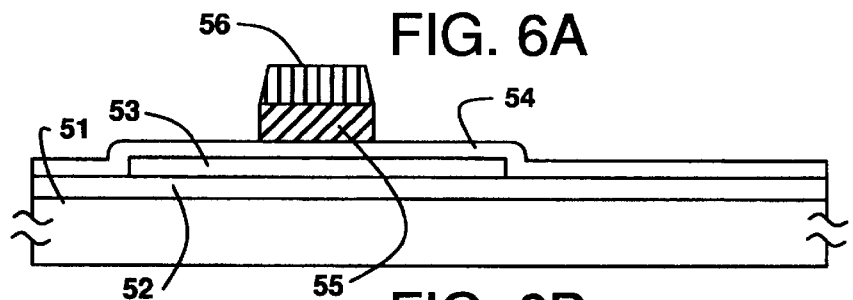
FIGS. 6A to 6F show the method for fabricating the semiconductor device according to the embodiment of the present invention.

Following that, an aluminum film (including 0.1 to 0.3 wt % of Sc) is deposited to a thickness of 3000 to 8000 Å, for example 6000 Å by the sputtering process. Then a thin anode oxide is formed to a thickness of 100 to 400 A is formed on the surface of the aluminum film. Then a photoresist is formed to a thickness of about 1 μm on thus treated aluminum film by the spin coating process. Then the gate electrode 55 is formed by the known photolithography process. Here, a photoresist mask 56 is retained on the gate electrode (FIG. 6A)

Figure 6B:
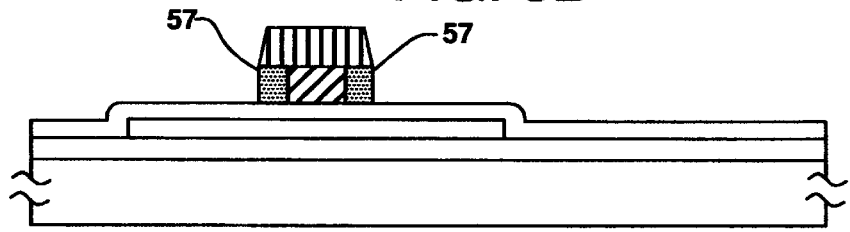

The substrate is soaked (immersed) in a 10% solution of oxalic acid. Then the substrate is subjected to 10 to 500 minutes, for example 200 min anodic oxidation at 5 to 50 V, or a rated voltage of 8 V so that porous anode oxide 57 is formed to a thickness of about 5000 Å on the side of the gate electrode. Since the mask material 56 is formed on an upper surface of the gate electrode, the anodic oxidation hardly proceeds. (FIG. 6B).

Figure 6C:
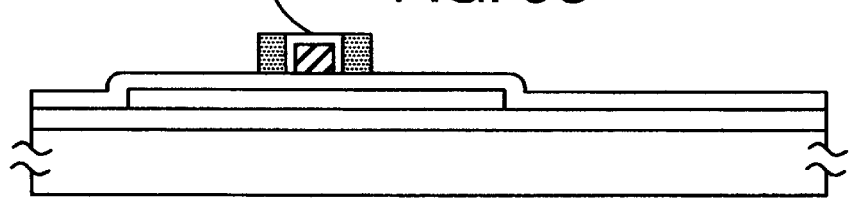

The mask material is removed, the upper surface of the gate electrode is exposed, and the substrate is soaked in an ethylene glycol solution of 3% oxalic acid (pH adjusted to neutrality in ammonium). Then current is allowed to pass therethrough at 1 to 5 V/min, for example 4 V/min to raise the voltage to 100 V for anodic oxidation. At this step, not only the upper surface of the gate electrode but also the side of the gate electrode are subjected to anodic oxidation so that fine nonporous anode oxide 58 is formed to a thickness of 1000 Å. A resisting voltage of the anodic oxide is 50 V or more. (FIG. 6C).

Figure 6D:
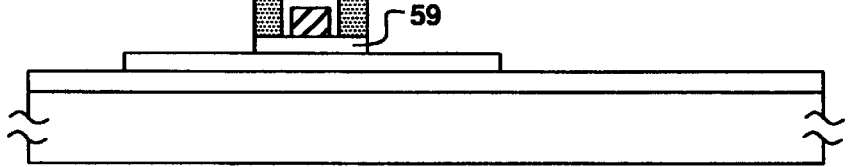

The silicon oxide 54 is etched by the dry etching process. In this etching, the anode oxides 37 and 38 are not etched, and only the silicon oxide film is etched. The silicon oxide film below the anode oxide is not etched and remains as the gate insulating film 59 (FIG. 6D)

Next, mixed acid of phosphoric acid, acetic acid and nitric acid is used to etch a porous anode oxide 57 to expose the nonporous anode oxide 58. Then, impurity (phosphorus) is doped into a silicon region 33 using the gate electrode 35 and the porous anode oxide 37 as masks by the plasma doping. The doping gas is phosphine ($PH_3$). The acceleration voltage is 5 to 30 kV, for example 10 kV. The dose is $1\times10^{14}$ to $8\times10^{15}$ cm$^{-2}$, for example $2\times10^{15}$ cm$^{-2}$.

At this doping, a high density of phosphorus is doped in a region 60 which is not covered with the gate insulating film

Figure 6E:
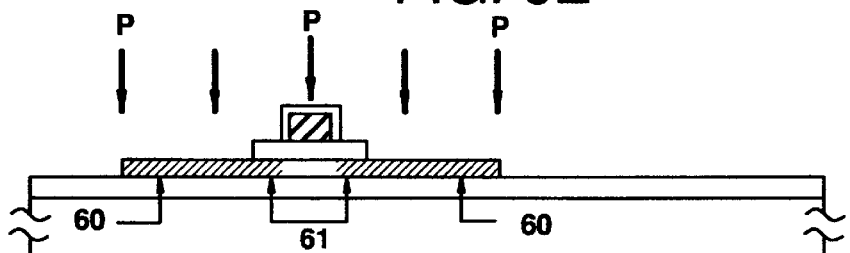

59. In a region 61 covered with the gate insulating film 59, the gate insulating film 59 hinders so that the doping amount is small. In Embodiment 6, only 0.1 to 5% of impurity is doped compared with the region 60. As a consequence, an N-type high impurity density region 60 and a P-type low impurity density region 61 are formed. (FIG. 6E)

Figure 6F:
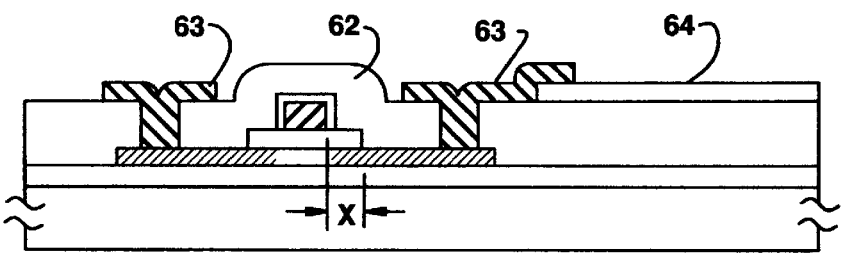

After that, the upper surface of the gate insulating film is irradiated with laser light so that laser annealing is carried out to activate the doped impurity. After that, the silicon oxide film 62 is formed to a thickness of 6000 Å as an interlayer insulator by plasma CVD. Then ITO electrode 64 which is to be pixel electrode is formed. Further, a contact hole is formed to form the electrode/wiring 63 of the source region and the drain region of the TFT with a multilayer of metal materials such as titanium nitride and aluminum. The substrate is subjected to 30 minute annealing at 350° C. in the atmosphere of one atm pressure hydrogen. At the above step, the TFT is completed. (FIG. 6F)

In Embodiment 6, it is possible to obtain a structure same as so-called low density drain (lightly doped drain, LDD) structure. Although it has been shown that the LDD structure is effective in suppressing the deterioration by the hot carrier, the same effect can be obtained in the TFT fabricated in Embodiment 6. However, compared with the process for obtaining the known LDD, Embodiment 6 is characterized in that the LDD can be obtained in one doping process. In addition, Embodiment 6 is characterized in that a high impurity density region 60 is defined by using the gate insulating film 59 defined by the porous anode oxide 57. That is, the impurity region is indirectly defined by the porous anode oxide 57. Then, as shown in the present invention, the width X of the LDD region is substantially determined by the width of the porous anode oxide.

By using the method according to Embodiment 6, a higher integration can be performed. Then, at this time, it is convenient to change the width x of the offset region or an LDD region depending on the characteristics required of the TFT. In particular, when the structure of Embodiment 6 is adopted, the offset current can be reduced so that Embodiment 6 is the most appropriate for the TFT which is intended to hold the electric load in the pixel electrode.

Embodiment 7

Figure 7:
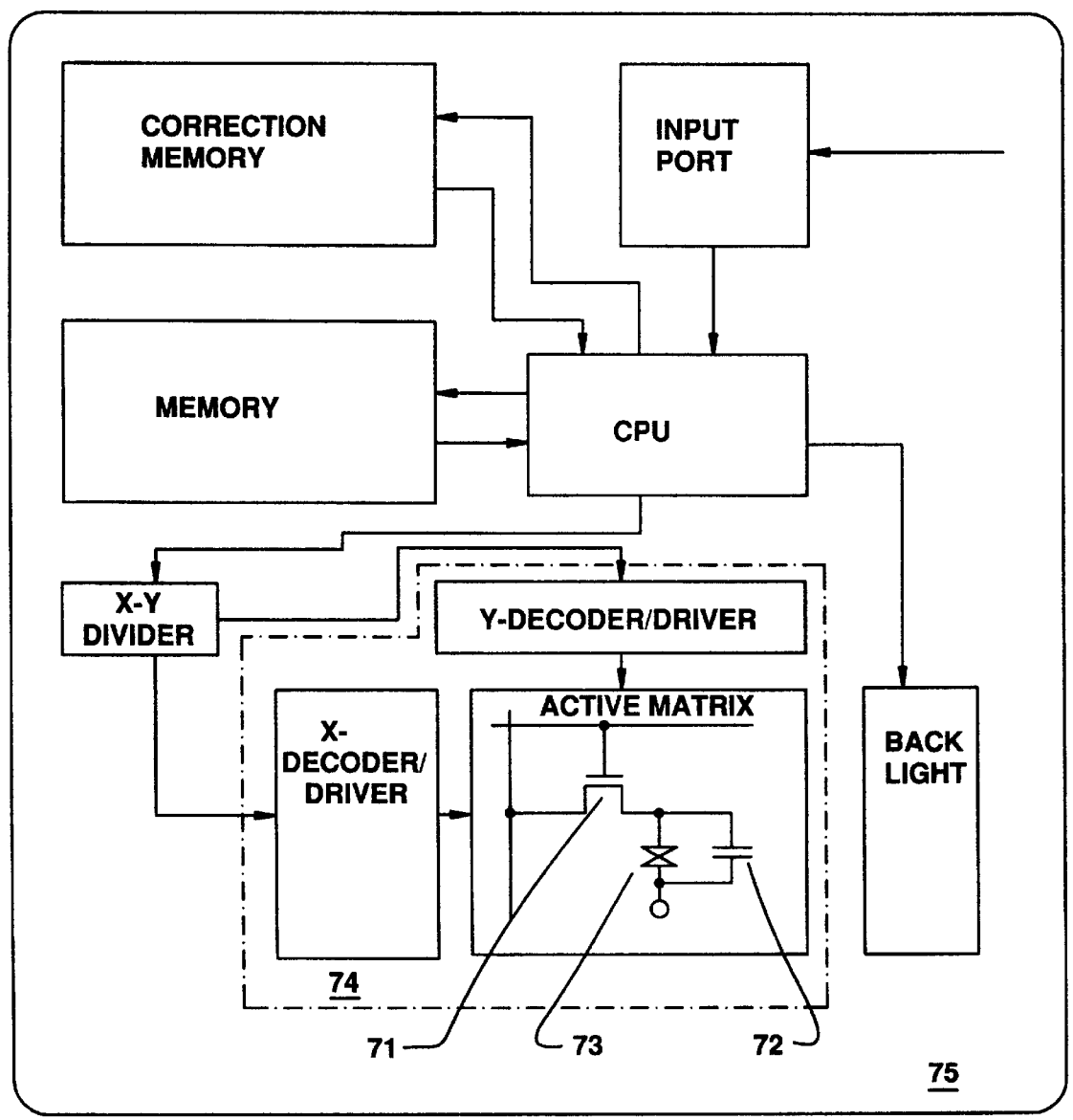
FIG. 7 shows a step in the method for fabricating the semiconductor device according to the embodiment of the present invention.

FIG. 7 shows a block diagram of an electro-optical system using an integrated circuit, the system mounting a display, a CPU, and a memory are mounted on a glass substrate. Here, an input port reads a signal input from outside and converts the signal into an image signal. An auxiliary memory refers to a memory for offering information peculiar to each pixel and individually correcting it as a non-volatile memory. In other words, when there is a point defect in a pixel of the electro-optical system, a signal which is corrected in accordance with the point defect is sent to a pixel surrounding the defect for covering the defect so as to obscure the defect. In addition, when the pixel is dark compared with the surrounding pixel, a larger signal is sent to the dark signal so as to produce the same brightness as the surrounding pixel.

The CPU and the memory is the same as those used in normal computers. In particular, the memory has as a RAM an image memory corresponding to each pixel. Further, the CPU is capable of changing a back light with which the rear surface of the substrate can be irradiated in accordance with image information.

Then, to provide a width of the offset region and the LDD region, three to ten systems of wirings are formed to enable individually changing the anode oxidation. Typically, in an active matrix circuit, the channel length is set to 10 $\mu$m, the width of that LDD region is set to 0.4 to 1 $\mu$m, for example, 0.6 $\mu$m. With respect to the driver, the channel length of a N-channel type TFT is set to 8 $\mu$m, the channel width thereof is set to 200 $\mu$m, and the width of the LDD region is set to 0.2 to 0.3 $\mu$m, for example, 0.25 $\mu$m. In the same manner, the channel length of a P-type TFT is set to 5 $\mu$m and the channel width is set to 10 $\mu$m. The width of the LDD region is set to 0 to 0.2 $\mu$m for example, 0.1 $\mu$m. With respect to the decoder, the channel length of the N-channel TFT is set to 8 $\mu$m and the channel width thereof is set to 10 $\mu$m. The width of the LDD region is set to 0.3 to 0.4 $\mu$m, for example 0.35 $\mu$m. In the same manner, the channel width of the P-type channel TFT is set to 5 $\mu$m and the channel width thereof is set to 500 $\mu$m. The width of the LDD region may be set to 0 to 0.2 $\mu$m, for example, 0.1 $\mu$m. Further, with respect to the NTFT and PTFT of the CPU, the input port, the correction memory, and memory in FIG. 6, the width of the LDD region may be optimized like a high frequency operation and low power consumption decoder. Thus, the electro-optical system 74 may be formed on the same substrate having an insulating surface.

The present invention is characterized in that the width of the high resistance region is variable in two to four kinds or even more depending on the usage thereof. In addition, the region may not be formed of the same material as the channel formation region nor in the same conductive type as the channel formation region. That is, a very small amount of N-type impurity is doped in the NTFT while a very small amount of P-type impurity is doped in the PTFT. Further, selective doping of carbon, oxygen, nitrogen or the like for the formation of a high resistance region is effective in preventing the deterioration, reliability, frequency characteristics and trade off with off current resulting from a hot carrier.

Also, it is preferable to use the TFT shown in FIGS. 3A through 5D as the TFT of a driver circuit for driving the TFT provided on the pixel electrode.

Embodiment 8

Embodiment 8 is characterized in that the embodiment is fabricated at steps schematically shown in the following explanation.

(1) An amorphous silicon film is crystallized by heat treatment using nickel element.
(2) 1/100 buffer acid is used to treat the silicon film crystallized at the above step with fluoric acid to remove the nickel component (nickel silicide) localized in the silicon film.
(3) The crystallinity of the silicon film crystallized at step (1) is accelerated by the laser light irradiation.
(4) A gate electrode is formed which is used as a mask to dope impurity ions for forming a source/drain region.
(5) The recrystallization of the source/drain region and the activation of the doped impurity is performed by heat treatment.

As described above, Embodiment 8 is characterized in that a cycle of heat treatment removal of nickel laser light irradiation heat treatment is performed. Here, the first heat treatment is intended for the crystallization of the amorphous silicon film. The laser light irradiation is intended for enhancing the crystallization of the amorphous silicon film. The second heat treatment is intended for the recrystallization of the source/drain region and the activation of impurity doped in the region, and for removal of the defects in the channel forming region.

A steps of fabricating a TFT shown in FIGS. 9A to 9D will be explained. In the beginning, on the glass substrate 901, a base silicon oxide film 902 is formed to a thickness of 2000 Å by the sputtering process. Next, the amorphous silicon film is formed to a thickness of 1000 Å by the plasma CVD and the reduced pressure CVD. Then nickel acetate is used to introduce the nickel element onto the surface of the amorphous silicon film. Then, the amorphous silicon film is crystallized by heat treatment to provide a crystalline silicon film 903. The crystalline silicon film is obtained by four hour treatment at 550° C.

Figure 9A:
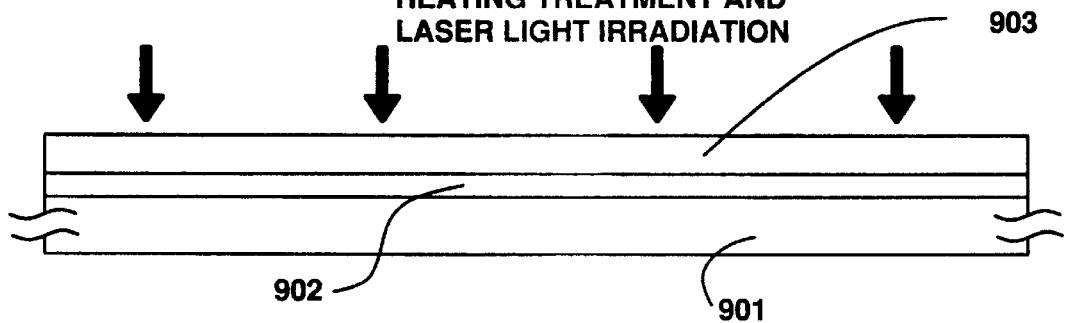
FIGS. 9A to 9D show the method for fabricating the semiconductor device according to the embodiment of the present invention.

After the completion of the above heat treatment, 1/100 buffer acid is used to treat the substrate with fluoric acid treatment to remove the nickel component localized (deflected) in the film. Then, the substrate is irradiated with XeCl excimer laser (having a wave length of 308 nm) and XeF excimer laser at an intensity of 300 mJ/cm$^2$ to accelerate the crystallization of the crystallinity of the crystalline silicon film 903. (FIG. 9A)

Then, the crystalline silicon film 903 is patterned to form an active layer of a TFT. Then the silicon oxide film which constitutes a gate insulating film is formed to a thickness of 1000 Å by plasma CVD. After the gate insulating film is formed, a film containing aluminum as a main component is formed to a thickness of 5000 Å. Then the film is patterned to form a gate electrode 905. Then the gate electrode 905 is used as an anode to subject the film to anodic oxidation in an electrolyte thereby forming an oxide layer 906 on the periphery of the gate electrode 905. The oxide layer 905 is formed to a thickness of 2000 Å.

Figure 9B:
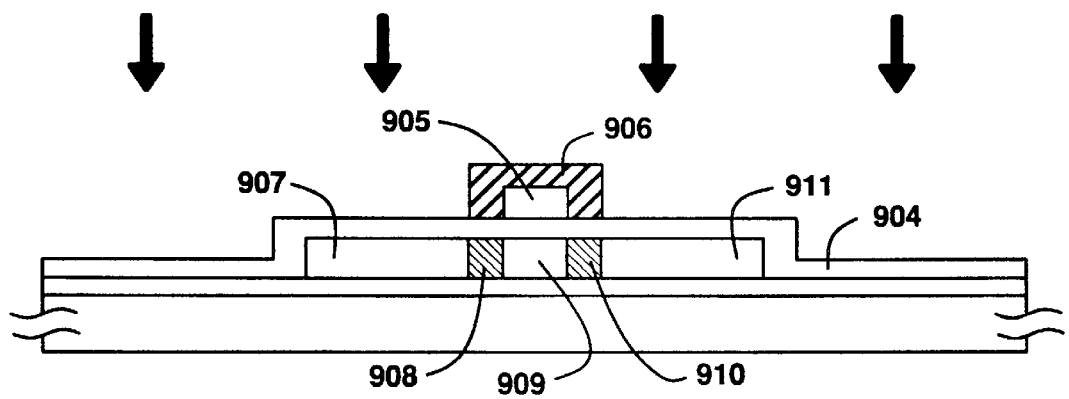
Figure 9C:
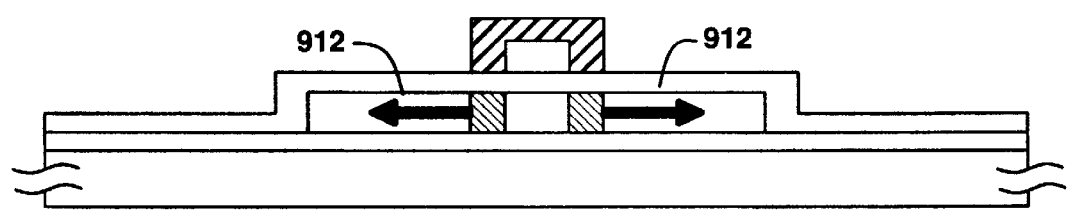
Figure 9D:
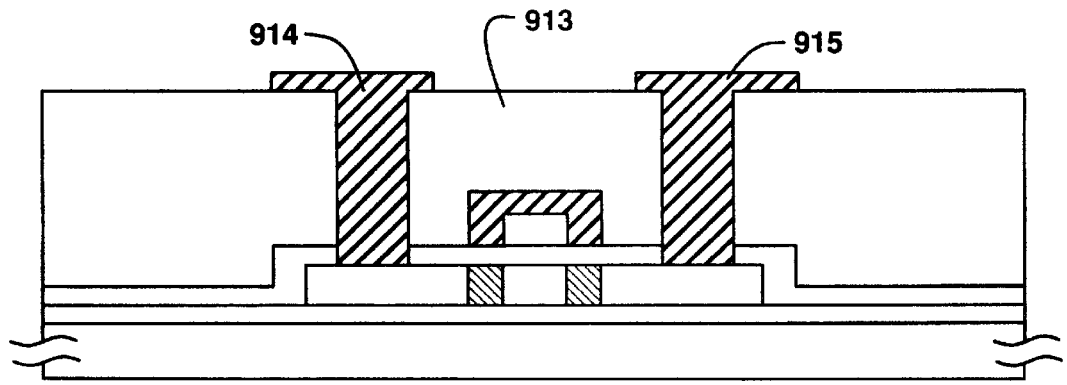
Figure 10:
FIG. 10 shows a photograph illustrating a state of a thin film of a crystalline silicon film that is subjected to fluoric acid treatment.
Figure 11:
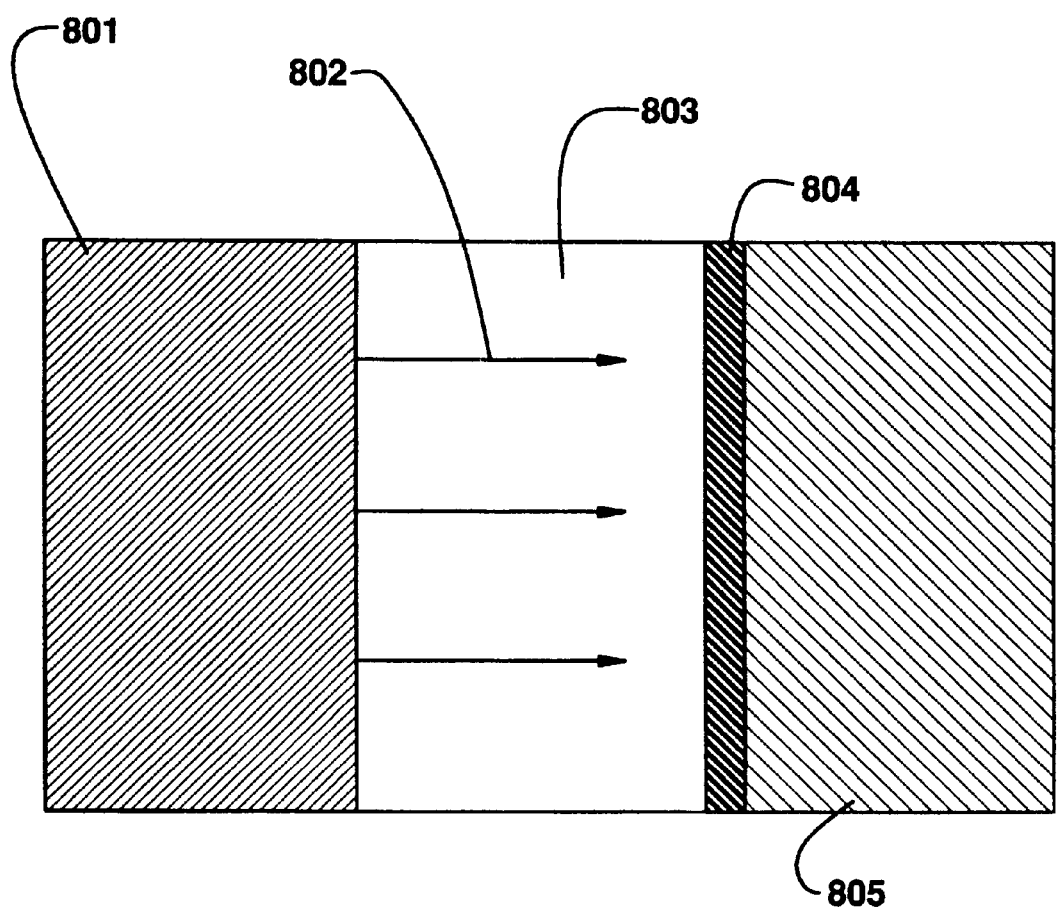
FIG. 11 shows a model view showing a photograph shown in FIG. 10.

The oxide layer 906 of the gate electrode 905 and on the periphery of the gate electrode 905 is used as a mask for doping impurity ions thereby forming in self-alignment a source region 907, a drain region 911, a channel formation region 909 and offset gate regions 908 and 910. Here to provide an N-type channel TFT, phosphorus ions are used as impurity ions. At this time, the source/drain region is rendered amorphous owing to the ion impact. (FIG. 9B)

At step shown in (C), the source region 907 and the drain region 911 are recrystallized and the doped phosphorus ions are activated by two hour heat treatment at 500° C. At this step, from an interface between the crystalline offset gate region 908 and the amorphous source region 907 a crystal shown by an arrow 912 is grown. This crystal growth proceeds with the offset gate region serving as a core thereof. Additionally, from the interface between the crystalline offset gate 910 and the amorphous drain region 911 a crystal is grown shown by an arrow 912. Such crystallization easily proceeds at 500° C. or less by the action of the phosphorus ions discharged in the source/drain region. Further, since a continuous crystalline structure can be obtained from an offset gate region, the concentration of defects resulting from lattice mismatch can be prevented.

This heat treatment at this step (C) may be carried out at 300° C. or more. In Embodiment 8, aluminum is used in the gate electrode. Further, the glass substrate has a heat resistance problem. Thus heat treatment may be carried out at 300 to 600° C.

The heat treatment step shown by symbol (C), it is effective to combine annealing by laser light with annealing by strong light before or after heat treatment.

The interlayer insulating film is formed to a thickness of 6000 Å by the plasma CVD process. In addition, the source electrode 914 and the drain electrode 915 are formed. Then the film is subjected to hydrogenation by heat treatment in the atmosphere of hydrogen at 350° C. to compete a TFT shown in (D).

In Embodiment 8 there is shown an embodiment of a structure constituting the offset gate regions 908 and 910. When the offset gate region is not formed, the crystallization proceeds from a crystalline channel formation region to the source/drain region in the heat treatment shown in (C).

The amorphous silicon film is crystallized at low temperature in a short time by introducing a metal element. Further, the silicon film is subjected to the fluoric acid treatment to remove the localized metal component. Further, a semiconductor device is fabricated by using a crystalline silicon film irradiated the silicon film with laser light or strong light and treated with heat treatment with the result that a device having a highly productivity and a favorable characteristics can be fabricated.

In particular, a crystalline silicon film having a low metal element density in the film can be obtained at a lower temperature compared with the prior art. By using this crystalline silicon film, a stable TFT with a small variation in characteristics can be obtained.

Embodiment 9

In the embodiment, when an active layer of a TFT is formed using a crystalline silicon film which has crystallized by using nickel and various cleanings or etchings (cleaning or etching for removing a metal element and various impurities) for the active layer are performed, these effects are described below.

In the embodiment, various characteristics of TFTs obtained by different conditions of cleaning or etching process for the active layer are compared with each other.

FIG. 12 shows different conditions of cleaning or etching process for the active layer. A difference in the formations of TFTs are only different conditions of FIG. 12.

In the conditions of FIG. 12, number 1 represents a condition for cleaning (etching) the surface of an active layer using BHF (buffer hydrofluoric acid) of 1/50. Number 2 represents a condition for cleaning the surface of an active layer by FPM obtained by diluting a mixture solution of hydrofluoric acid and hydrogen peroxide with water. Number 3 represents a condition for cleaning an active layer with ozone water after cleaning it with FPM. Number 4 represents a condition for cleaning an active layer with FPM after cleaning it with ozone water. Number 5 represents a condition for cleaning the surface of an active layer with a mixture of hydrogen peroxide sulfate, ammonia hydrogen peroxide, hydrogen peroxide hydrochloric acid and 1/100 hydrofluoric acid. Number 6 represents a condition for cleaning an active layer with FPM after cleaning it with hydrogen peroxide sulfate. Number 7 represents a condition for cleaning an active layer with BHF including surface active agent after cleaning it with ozone water.

After cleaning processes with various conditions as shown in FIG. 12, a gate insulating film is formed. Further, a gate electrode, source and drain regions, an interlayer insulating film and source and drain electrodes are formed to complete each TFT.

Figure 13:
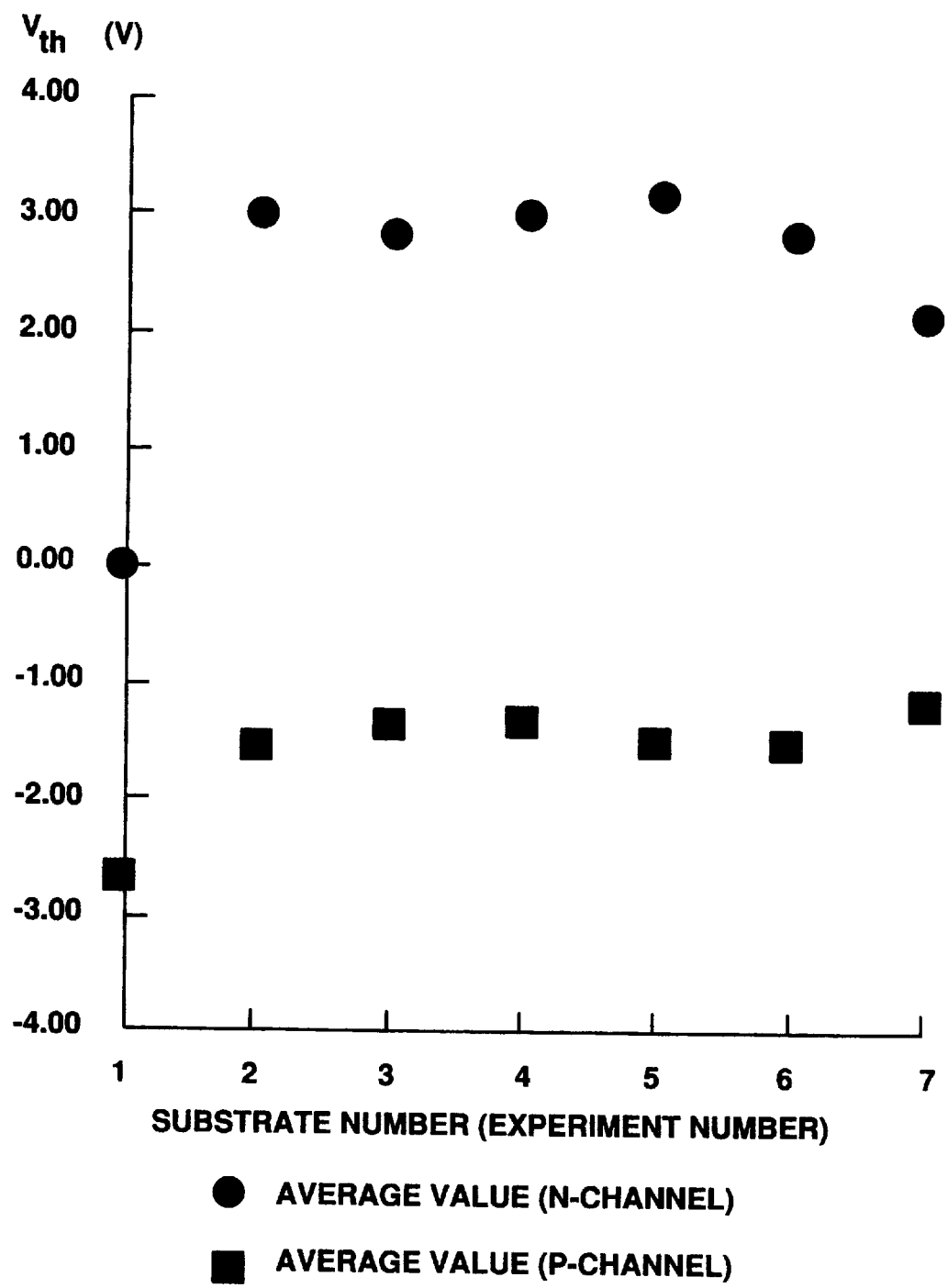
FIG. 13 shows a threshold voltage $V_{th}$ data of the obtained TFTs in the conditions of FIG. 12.

FIG. 13 shows a threshold voltage $V_{th}$ data of the obtained TFT. A substrate number in a transverse axis corresponds to an experimental number of FIG. 12. As can be seen from FIG. 13, TFTS produced in the experiment conditions 2 to 7 have normally off (a transistor has an off state in a case wherein a voltage applied to a gate electrode is 0 V or higher) characteristic which $V_{th}$ in an N-channel type is +2 to +3 V and which $V_{th}$ in a P-channel type is −1 to −2 V. Such characteristic is preferred in a case that a TFT is actually utilized. However, in the condition 1, since $V_{th}$ characteristic of a P-channel type is different from that of an N-channel type, it is not preferred.

Figure 14:
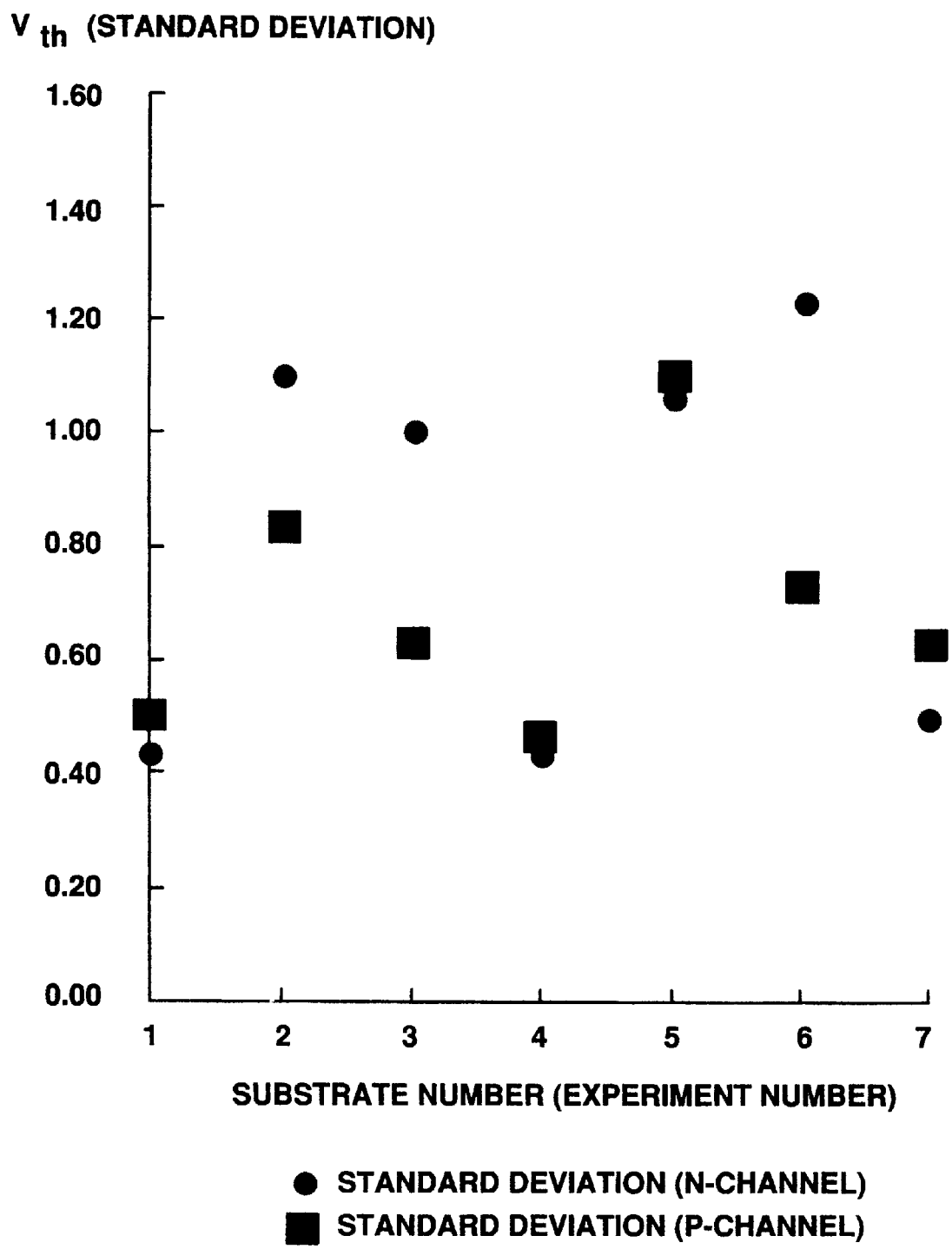
FIG. 14 shows standard deviations indicating the degree of deviation of $V_{th}$ value in FIG. 13.

FIG. 14 shows standard deviations indicating the degree of deviation of $V_{th}$ value. From FIG. 14, $V_{th}$ characteristic with less deviation is obtained in conditions 1, 4 and 7, this represents that TFTs having uniform $V_{th}$ characteristics can be obtained in these conditions 1, 4 and 7.

However, as shown in FIG. 13, the characteristic in the condition 1 is not preferred. Therefore, in total estimation with respect to $V_{th}$ characteristic and its deviation, the conditions 4 and 7 are preferred.

Figure 15:
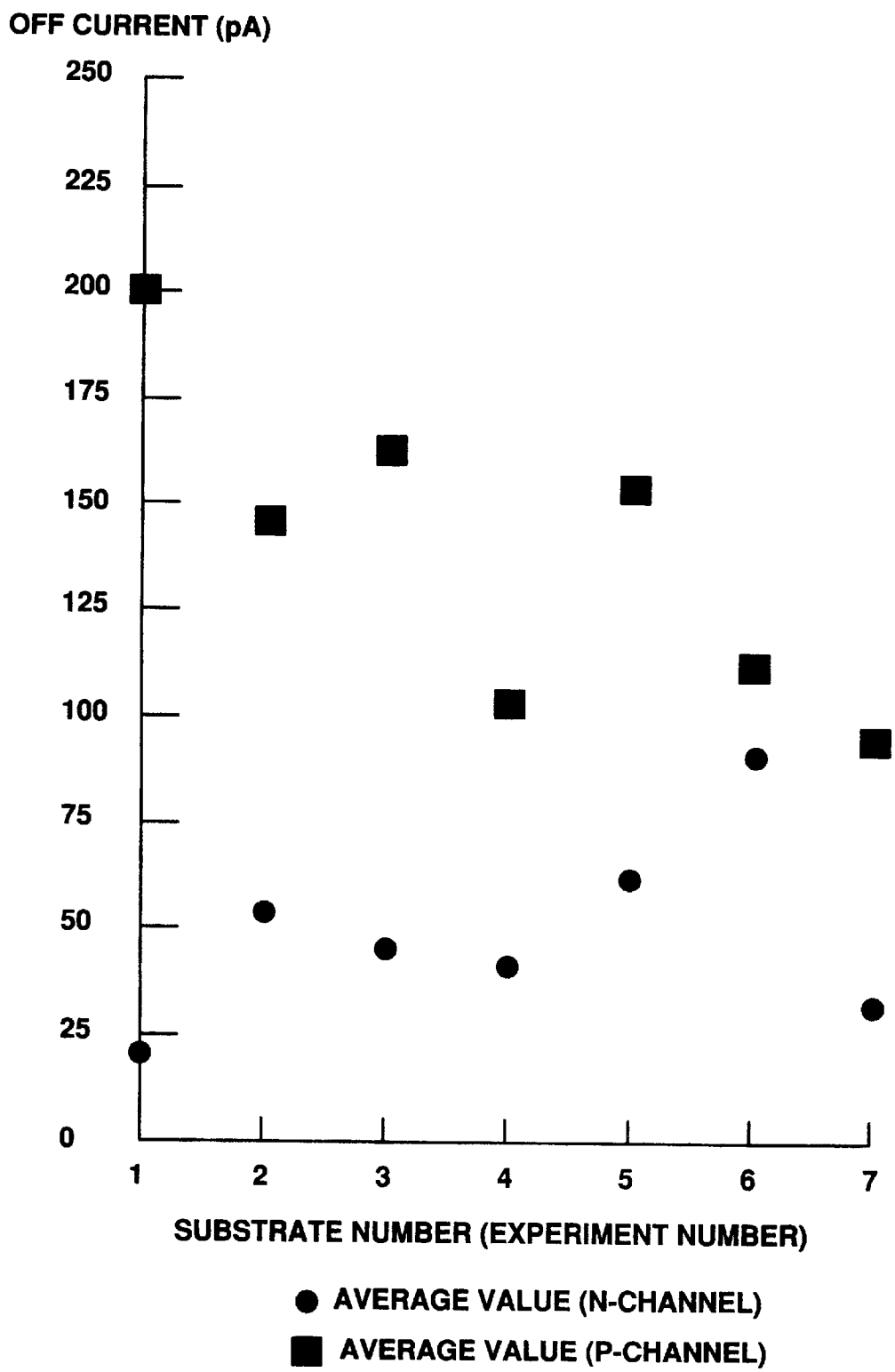
FIG. 15 shows off current characteristics corresponding to each condition of FIG. 12.

FIG. 15 shows off current characteristics corresponding to each condition of FIG. 12, in particular, off current values in a case wherein $V_D$=14 V, $V_G$=−4.5 V in an N-channel type and in a case wherein $V_D$=14 V, $V_G$=4.5 V in a P-channel type. As can be seen from FIG. 15, in the conditions 4 and 7, minimum off current values in both an N-channel type and a P-channel type are obtained.

Figure 16:
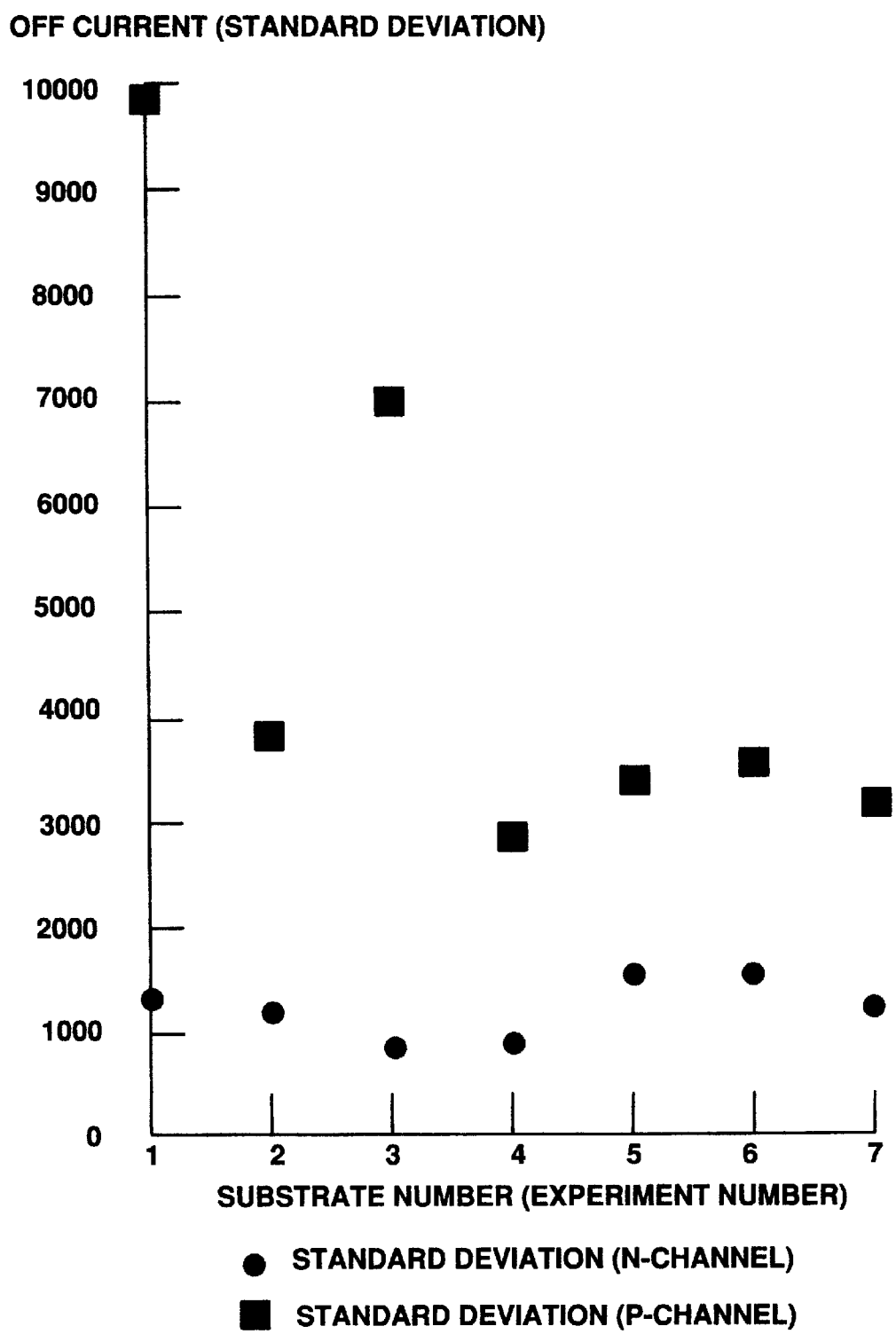
FIG. 16 shows standard deviations of the off current values shown in FIG. 15.

FIG. 16 shows standard deviations of the off current values shown in FIG. 15. From FIG. 15, in the condition 4, an off current characteristic with less deviation is obtained. From the above data, the following conclusion can be obtained. That is, when cleaning is performed with ozone water, and then cleaning (etching) is performed with an etchant including hydrofluoric acid, a TFT having good characteristic with less deviation can be obtained.

It is considered that the following represents a reason to obtain preferable effect by such processes.

In an ideal state, it is required that bonds of silicon atoms in a surface of an active layer are terminated by hydrogen atoms. However, in actual, a number of bonds of silicon atoms are substantially terminated by impurities such as organic substances. This state leads to the generation of a trap level with a high density. If metal elements for promoting crystallization are exposed on a surface of an active layer, a trap level is generated in the exposed position. Further, in a case that an active layer of a TFT is formed by patterning, dangling bonds are formed (produced) on a surface of the active layer. In particular, when dry etching with plasma is performed, this is indicated remarkably by plasma damage. Therefore, such state leads to the generation of a trap level with a high density.

By such trap level, the shift of $V_{th}$ and its deviation, the increase of an off current value and its deviation occur. That is, by moving carrier through the trap level, the shift of $V_{th}$ and the increase of an off current value occur. Also, since moving of carrier through the trap level is unstable, the deviations in the shift of $V_{th}$ and an off current value produce.

In such state, when the processes as shown in the conditions 4 and 7 of FIG. 12 are performed for a surface of an active layer, impurities such as organic substances and metal elements which are existed on a surface of an active layer can be removed. That is, an organic substance and a metal element become oxides by processing with ozone water having strong oxidation, then by further etching with an etchant solution including hydrofluoric acid, the oxides are removed, so that a trap level existed on a surface of an active layer can be decreased.

It is important to perform processing with ozone water having strong oxidation firstly in order to change an organic substance and a metal element to be removed into oxides, and then to remove the oxides.

It is useful to fabricate each kind of semiconductor device by using a crystalline silicon film obtained by using the invention disclosed in the specification.

What is claimed is:

1. A method for manufacturing a semiconductor device comprising the steps of:

forming a semiconductor film over a substrate having an insulating surface;

disposing an invasive type element in contact with said semiconductor film, said invasive type element being capable of promoting crystallization of said semiconductor film;

heating said semiconductor film provided with said invasive type element in order to crystallize said semiconductor film, wherein said invasive type element is localized in the semiconductor film;

removing said localized invasive type element from said semiconductor film after the heating step;

irradiating said semiconductor film with laser light or intense light after the removing step; and patterning said irradiated semiconductor film to form at least one semiconductor island.

2. A method according to claim 1, wherein said invasive type element is selected from the group consisting of Fe, Co, Ni, Ru, Rh, Pd, Os, Ir, Pt, Cu, Ag, and Au.

3. A method according to claim 1, wherein said irradiating step is performed with an infrared ray and intensity of said infrared ray is adjusted so that a temperature on a single crystal silicon wafer ranges between 900 to 1200° C.

4. A method according to claim 3, wherein said temperature on the single crystal silicon wafer rises at a constant rate of 50 to 200° C./sec.

5. A method according to claim 1 further comprising a step of removing impurities on a surface of said semiconductor film by processing with ozone water before the step of removing said invasive type element.

6. A method according to claim 1, wherein said invasive type element is removed from said semiconductor film by processing with an etchant including hydrofluoric acid.

7. A method according to claim 1 wherein said heating step is performed at 450 to 600° C. for about four hours.

8. A method for manufacturing a semiconductor device comprising the steps of:

forming a semiconductor film over a substrate having an insulating surface;

disposing a metal compound in contact with said semiconductor film, said metal compound including an element for promoting crystallization of said semiconductor film;

diffusing said element into said semiconductor film by heating in order to crystallize the semiconductor film, thereby said element is localized in the crystallized semiconductor film;

removing said localized element from said semiconductor film after the heating; and irradiating said semiconductor film with laser light or intense light after the removing step; and patterning said irradiated semiconductor film to form at least one semiconductor island.

9. A method according to claim 8, wherein said element is selected from the group consisting of Fe, Co, Ni, Ru, Rh, Pd, Os, Ir, Pt, Cu, Ag, and Au.

10. A method according to claim 8, wherein said irradiating step is performed with an infrared ray and intensity of the infrared ray is adjusted so that a temperature on a single crystal silicon wafer ranges between 900 to 1200° C.

11. A method according to claim 10, wherein the temperature on the single crystal silicon wafer rises at a constant rate of 50 to 200° C./sec.

12. A method according to claim 8, further comprising a step of removing impurities on a surface of said semiconductor film by processing with ozone water before the step of removing said element.

13. A method according to claim 8, wherein said element is removed from said semiconductor film by processing with an etchant including hydrofluoric acid.

14. A method according to claim 8, wherein said heating is performed at 450 to 600° C. for about four hours.

15. A method for manufacturing a semiconductor device comprising the steps of:

forming a semiconductor film over a substrate having an insulating surface;

disposing an invasive type element in contact with said semiconductor film, said invasive type element being capable of promoting crystallization of said semiconductor film;

diffusing said invasive type element from said semiconductor film by heating said semiconductor film;

removing said diffused invasive type element from said semiconductor film after the heating, thereby a plurality of pores are generated in the semiconductor film;

irradiating said semiconductor film with laser light or intense light in order to reduce pores; and then forming an insulating film on the semiconductor film.

16. A method according to claim 15, wherein said invasive type element is selected from the group consisting of Fe, Co, Ni, Ru, Rh, Pd, Os, Ir, Pt, Cu, Ag, and Au.

17. A method according to claim 15, wherein said irradiating step is performed with an infrared ray and intensity of the infrared ray is adjusted so that a temperature on a single crystal silicon wafer ranges between 900 to 1200° C.

18. A method according to claim 17, wherein the temperature on the single crystal silicon wafer rises at a constant rate of 50 to 200° C./sec.

19. A method according to claim 15, further comprising a step of removing impurities on a surface of said semiconductor film by processing with ozone water before the removing said catalyst material.

20. A method according to claim 15, wherein said invasive type element is removed from said semiconductor film by processing with an etchant including hydrofluoric acid.

21. A method according to claim 15, wherein said heating is performed at 450 to 600° C. for about four hours.

22. A method of manufacturing a semiconductor device comprising the steps of:

forming a semiconductor film on an insulating surface;

disposing a material in contact with said semiconductor film, said material being capable of promoting crystallization of said semiconductor film;

heating said semiconductor film provided with said material in order to crystallize said semiconductor film;

removing organic impurities on a surface of said semiconductor film by processing with ozone water; and then irradiating the semiconductor film with laser light or intense light after the removing step.

23. A method according to claim 22, wherein said material is selected from the group consisting of Fe, Co, Ni, Ru, Rh, Pd, Os, Ir, Pt, Cu, Ag, and Au.

24. A method to claim 22, wherein said irradiating step is performed with an infrared ray and intensity of the infrared ray is adjusted so that a temperature on a single crystal silicon wafer ranges between 900 to 1200° C.

25. A method according to claim 24, wherein the temperature on the single crystal silicon wafer rises at a constant rate of 50 to 200° C./sec.

26. A method according to claim 22, further comprising a step of removing said material from said semiconductor film after the removing impurities on a surface.

27. A method according to claim 26, wherein said material is removed from said semiconductor film by processing with an etchant including hydrofluoric acid.

28. A method according to claim 22, wherein said heating is performed at 450 to 600° C. for about four hours.

* * * * *